(12) United States Patent
Yang et al.

(10) Patent No.: US 10,482,984 B2
(45) Date of Patent: Nov. 19, 2019

(54) RAMP DOWN SENSING BETWEEN PROGRAM VOLTAGE AND VERIFY VOLTAGE IN MEMORY DEVICE

(71) Applicant: SanDisk Technologies LLC, Plano, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/952,752

(22) Filed: Apr. 13, 2018

(65) Prior Publication Data

US 2019/0318792 A1 Oct. 17, 2019

(51) Int. Cl.

| G11C 16/34 | (2006.01) |
|---|---|
| H01L 27/11556 | (2017.01) |
| H01L 27/11582 | (2017.01) |
| G11C 16/04 | (2006.01) |
| G11C 16/10 | (2006.01) |
| G11C 16/26 | (2006.01) |

(52) U.S. Cl.
CPC ...... *G11C 16/3463* (2013.01); *G11C 16/0483* (2013.01); *G11C 16/10* (2013.01); *G11C 16/26* (2013.01); *G11C 16/3459* (2013.01); *H01L 27/11556* (2013.01); *H01L 27/11582* (2013.01); *G11C 16/0408* (2013.01); *G11C 16/0466* (2013.01)

(58) Field of Classification Search
CPC .................. G11C 16/3459; G11C 16/3463
USPC .................................................... 365/185.28
See application file for complete search history.

(56) References Cited

U.S. PATENT DOCUMENTS

| 6,671,207 B1 | 12/2003 | Parker |
| 7,349,261 B2 * | 3/2008 | Mokhlesi ............ G11C 8/08 365/185.02 |
| 7,996,736 B2 | 8/2011 | Bottelli et al. |

(Continued)

OTHER PUBLICATIONS

U.S. Appl. No. 15/910,998, filed Mar. 2, 2018 by Yang et al.

(Continued)

*Primary Examiner* — Son L Mai
(74) *Attorney, Agent, or Firm* — Vierra Magen Marcus LLP

(57) ABSTRACT

Apparatuses and techniques are described for optimizing a program operation in a memory device. A storage location stores programing data for each word line, such as a program voltage for a set of memory cells. The set of memory cells may be periodically evaluated to determine updated programming setting(s). In one approach, the evaluation involves repeatedly sensing the set of memory cells between a program pulse and a verify signal in a program loop. The word line voltage can be stepped down to an intermediate voltage, then ramped down at a controlled rate while repeatedly sensing the memory cells, such as to detect an upper or lower tail of a threshold voltage distribution. The position of the tail can indicate a degree of over programming and this information can be used to adjust the programming setting(s) in a subsequent program operation.

22 Claims, 22 Drawing Sheets

(56) References Cited

U.S. PATENT DOCUMENTS

| 8,472,245 B2* | 6/2013 | Kim ................. G11C 16/0483 |
| | | 365/185.03 |
| 9,152,488 B2 | 10/2015 | Presman et al. |
| 9,368,211 B2 | 6/2016 | Asaoka et al. |
| 9,406,377 B2 | 8/2016 | Conley et al. |
| 9,406,396 B2 | 8/2016 | Sehgal et al. |
| 9,543,030 B1 | 1/2017 | Amarnath et al. |
| 9,875,812 B2 | 1/2018 | Otterstedt et al. |
| 9,892,791 B2 | 2/2018 | Li et al. |
| 2009/0161432 A1 | 6/2009 | Kim et al. |
| 2014/0365836 A1 | 12/2014 | Jeon et al. |
| 2015/0078093 A1 | 3/2015 | Hahn et al. |
| 2015/0124526 A1 | 5/2015 | Kim |
| 2017/0046220 A1 | 2/2017 | Sharon et al. |
| 2017/0256320 A1 | 9/2017 | Lang et al. |

OTHER PUBLICATIONS

U.S. Appl. No. 15/430,299, filed Feb. 10, 2017 by Yu et al.
International Search Report & the Written Opinion of the International Searching Authority dated May 27, 2019, International Application No. PCT/US2019/017067.

* cited by examiner

Map 119

| Word line: | Storage location: |
|---|---|
| WL0 | NS 704n |
| WL1 | NS 705n |
| WL2 | NS 706n |
| WL3 | NS 707n |
| ... | |

| Storage location: | Prog. Data: |
|---|---|
| NS 704n | 15 V |
| NS 705n | 15.5 V |
| NS 706n | 16 V |
| NS 707n | 15 V |
| ... | |

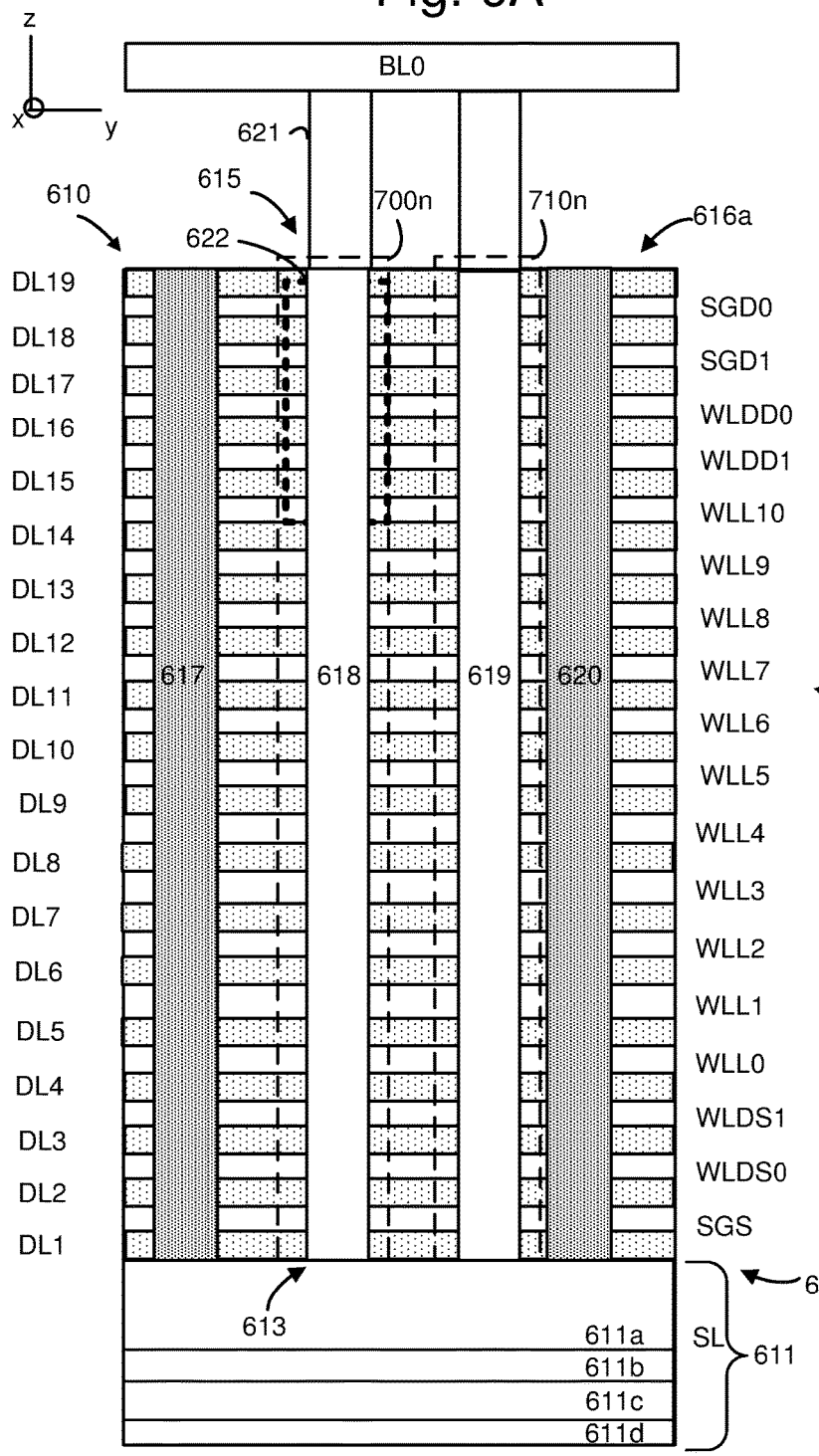
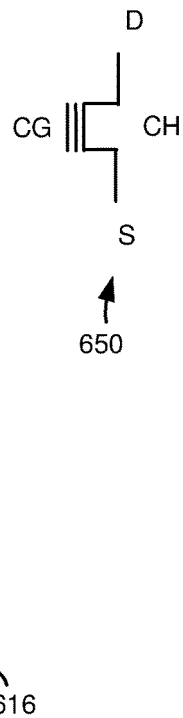
Fig. 6A
Fig. 6B

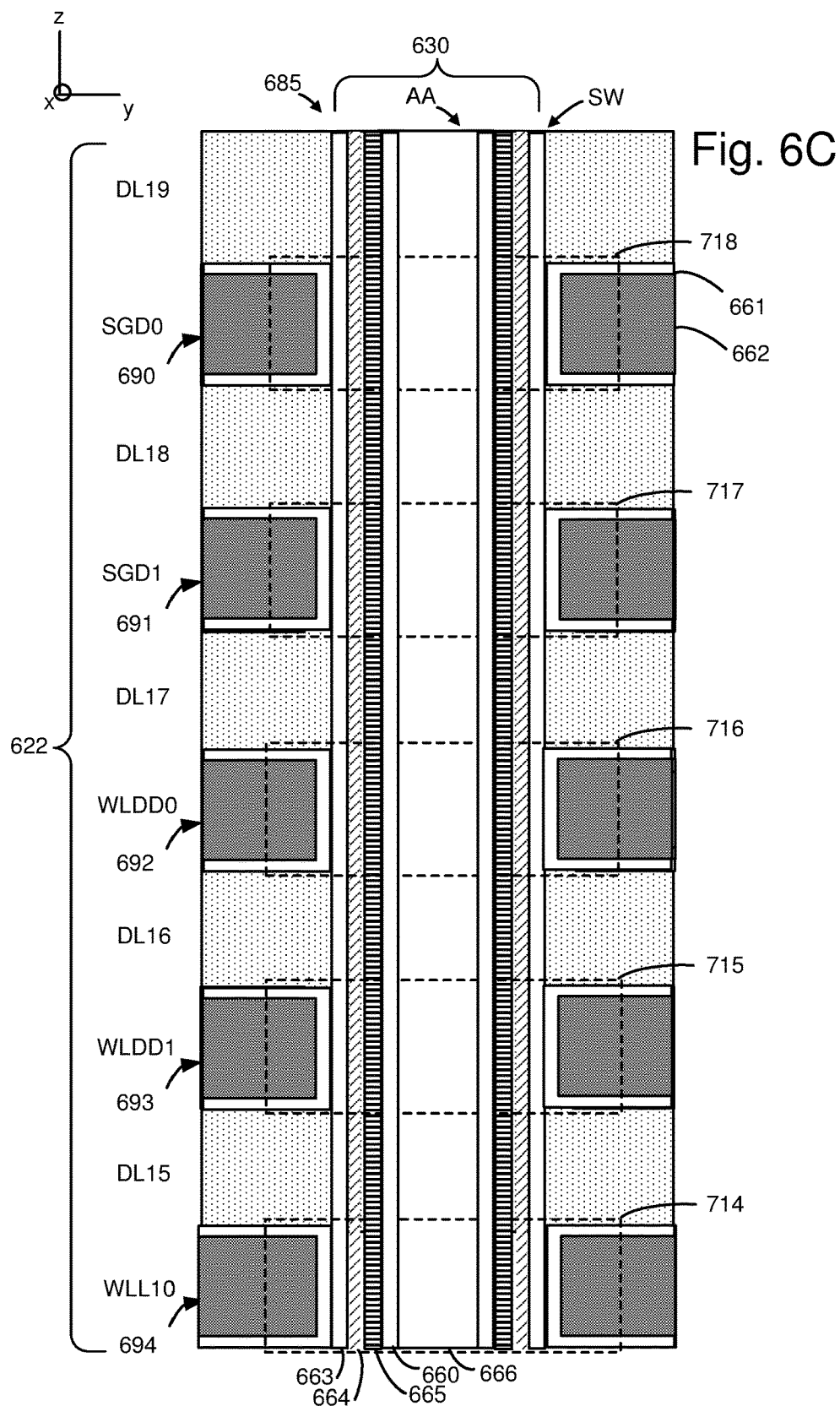

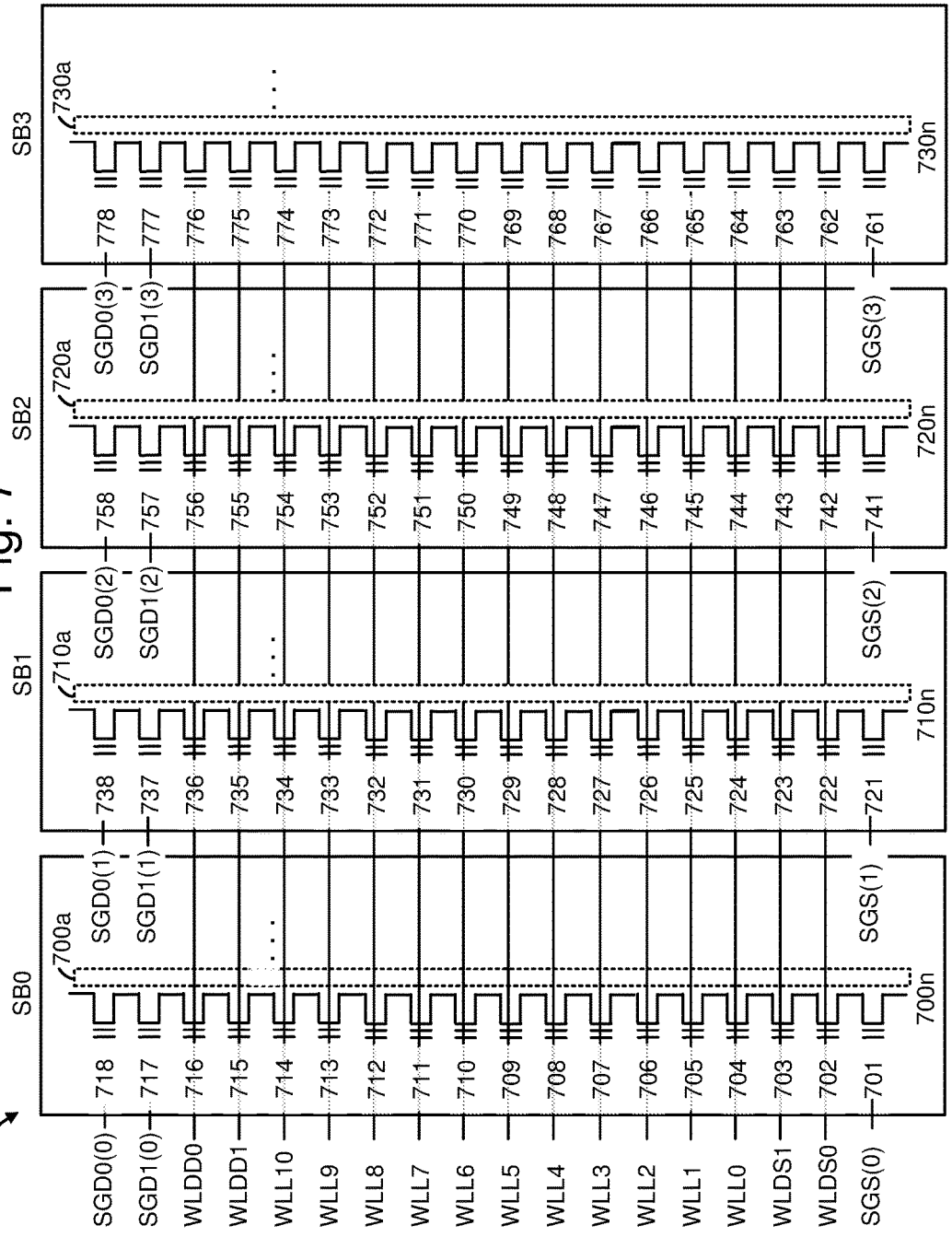

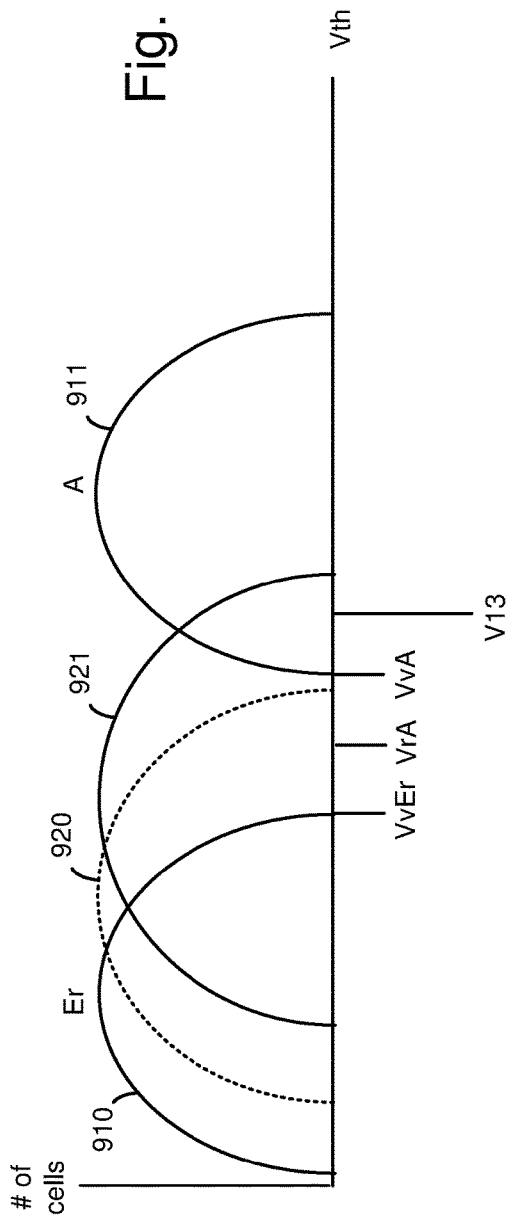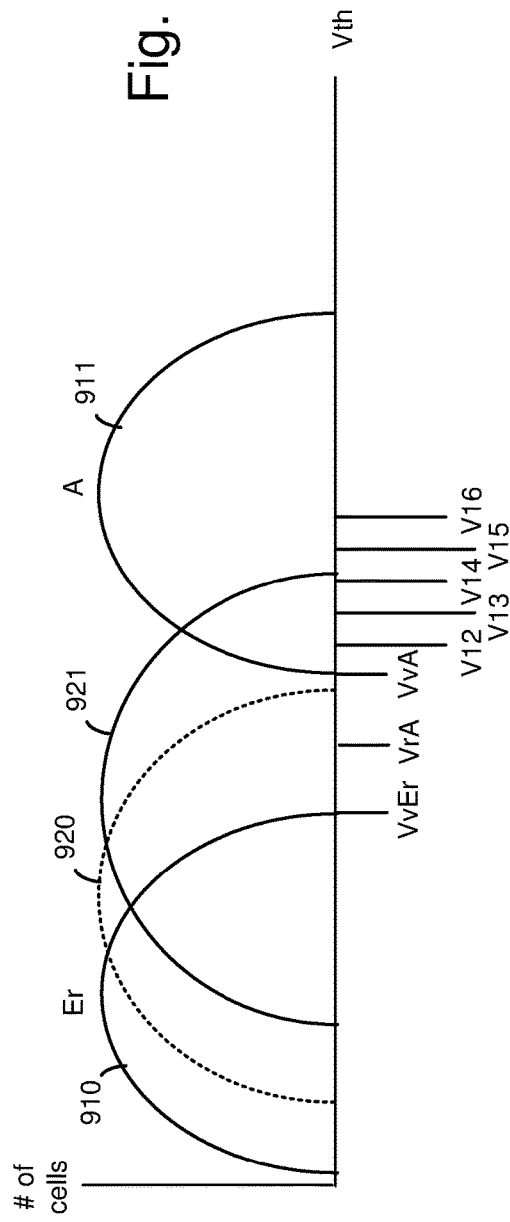

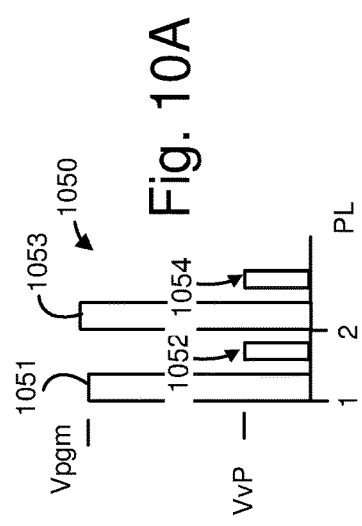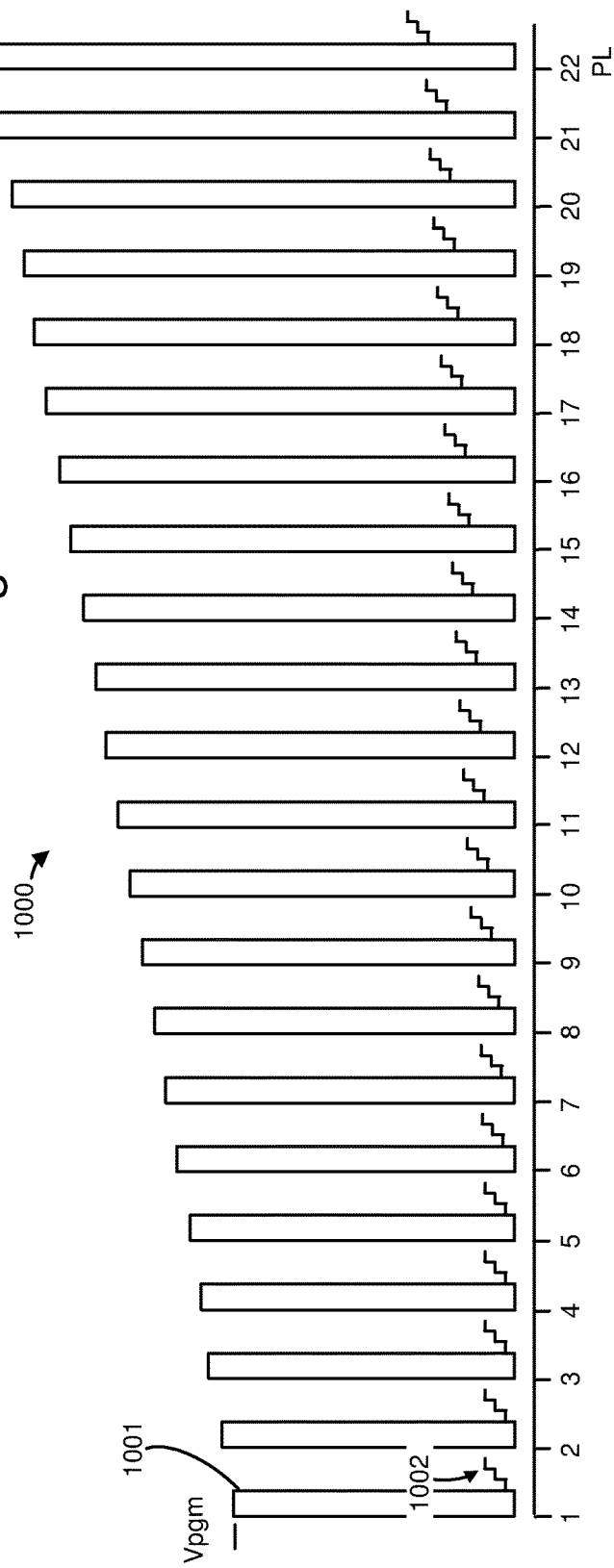

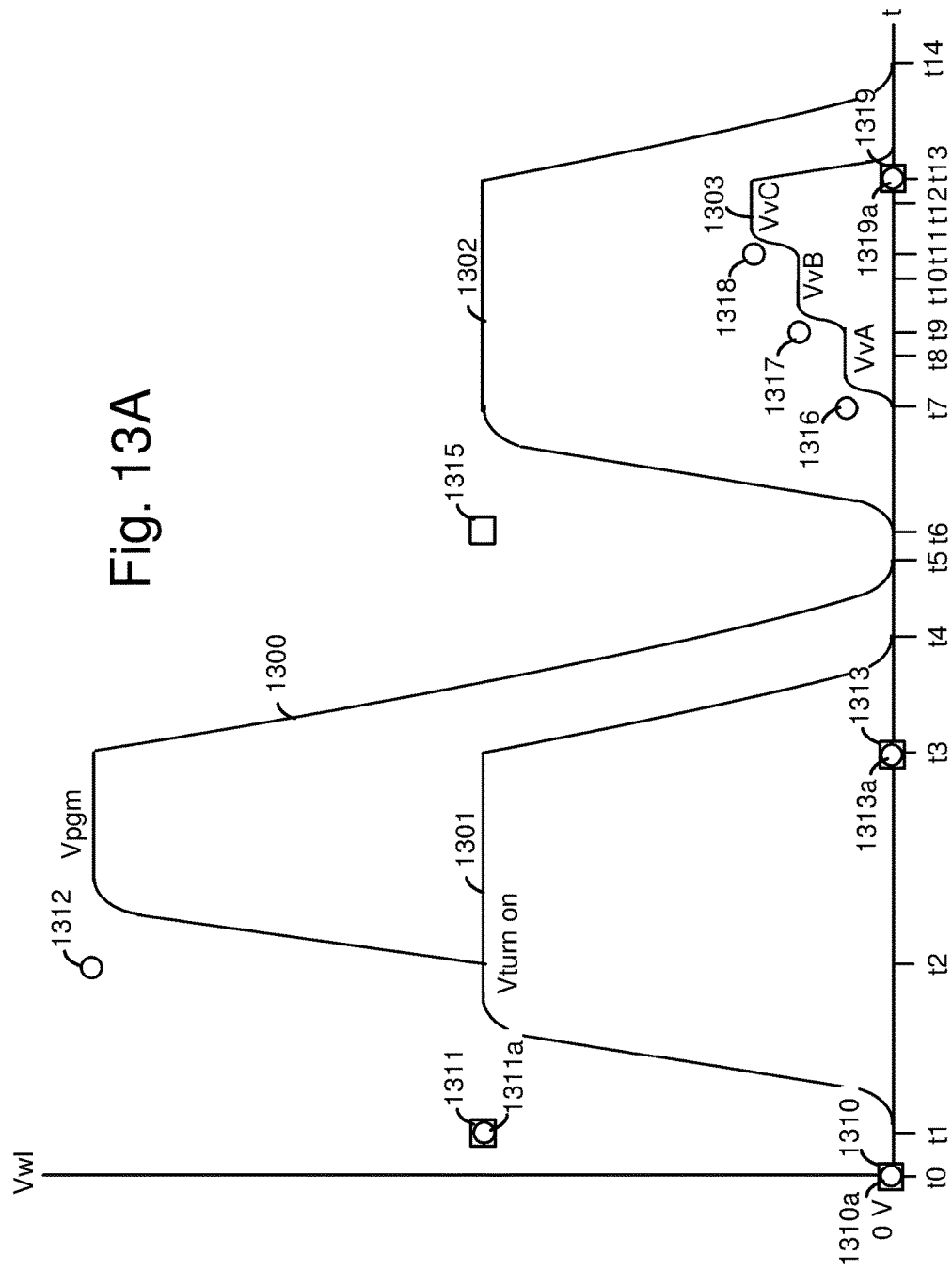

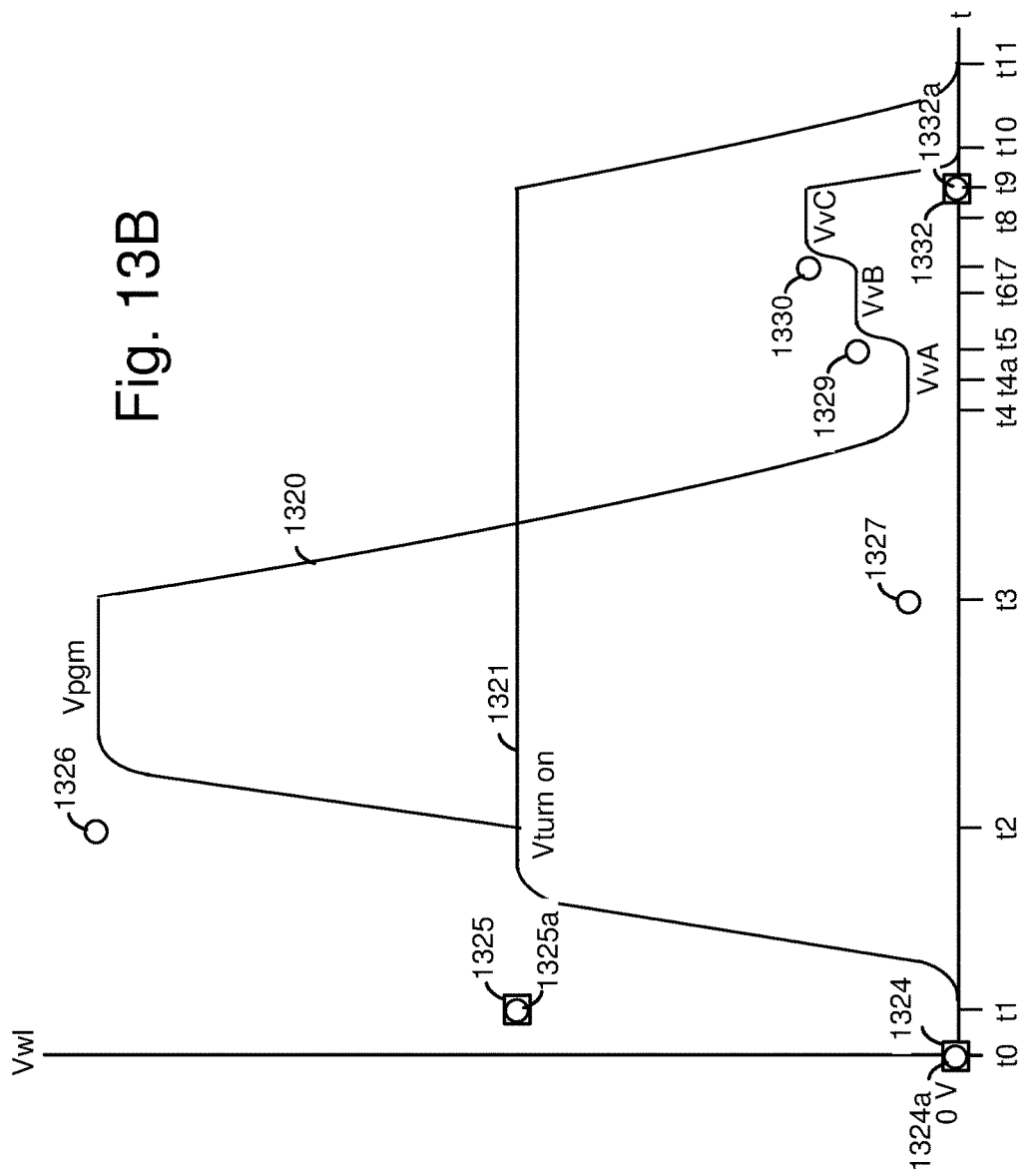

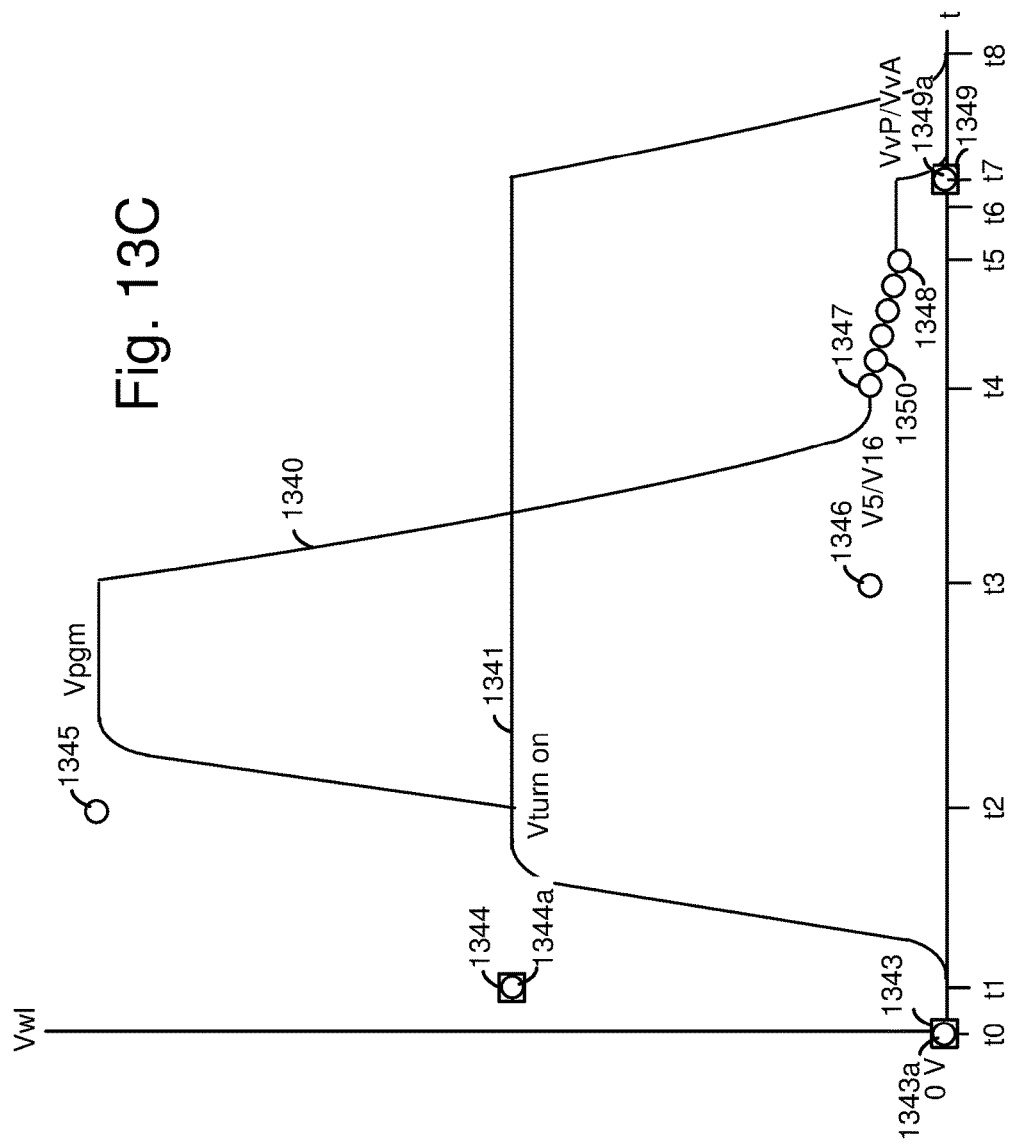

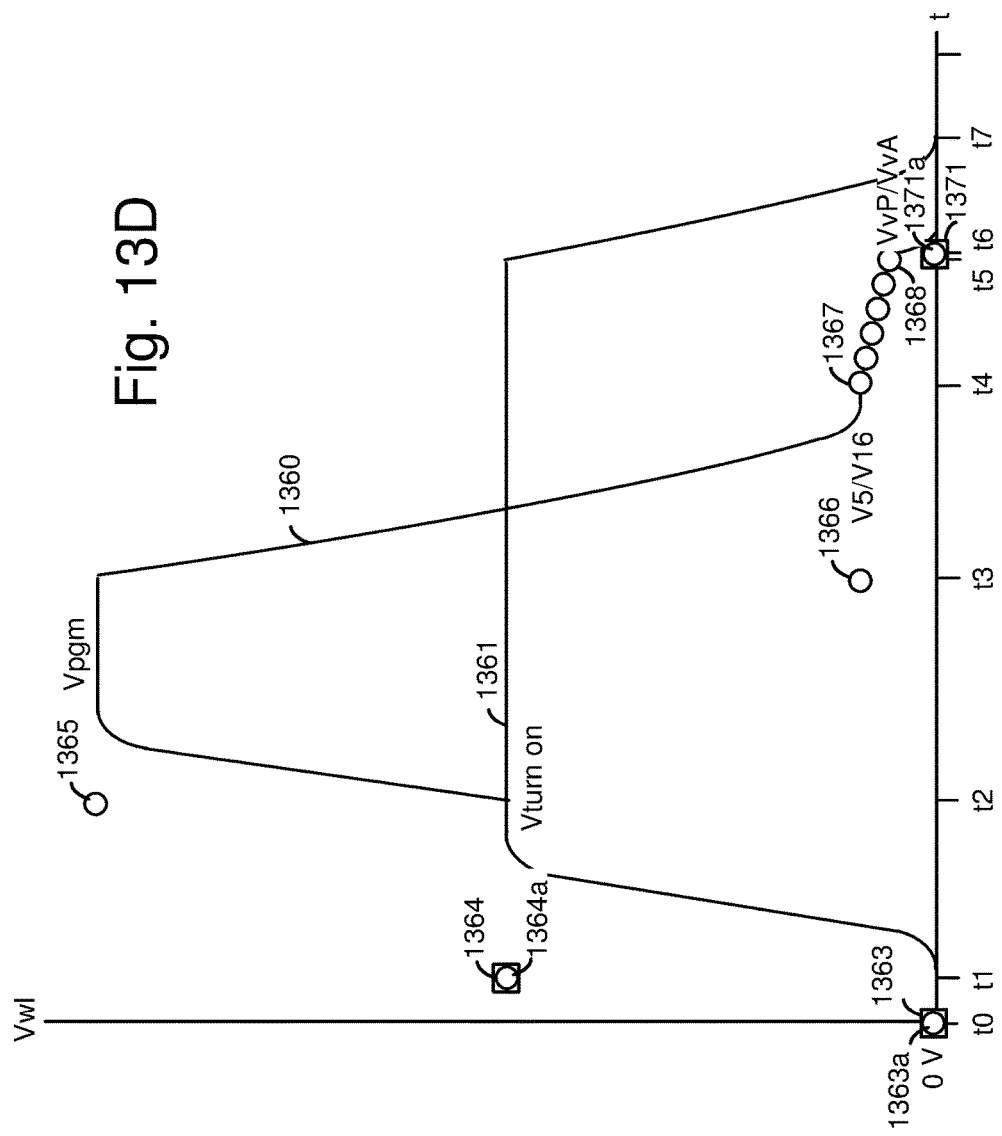

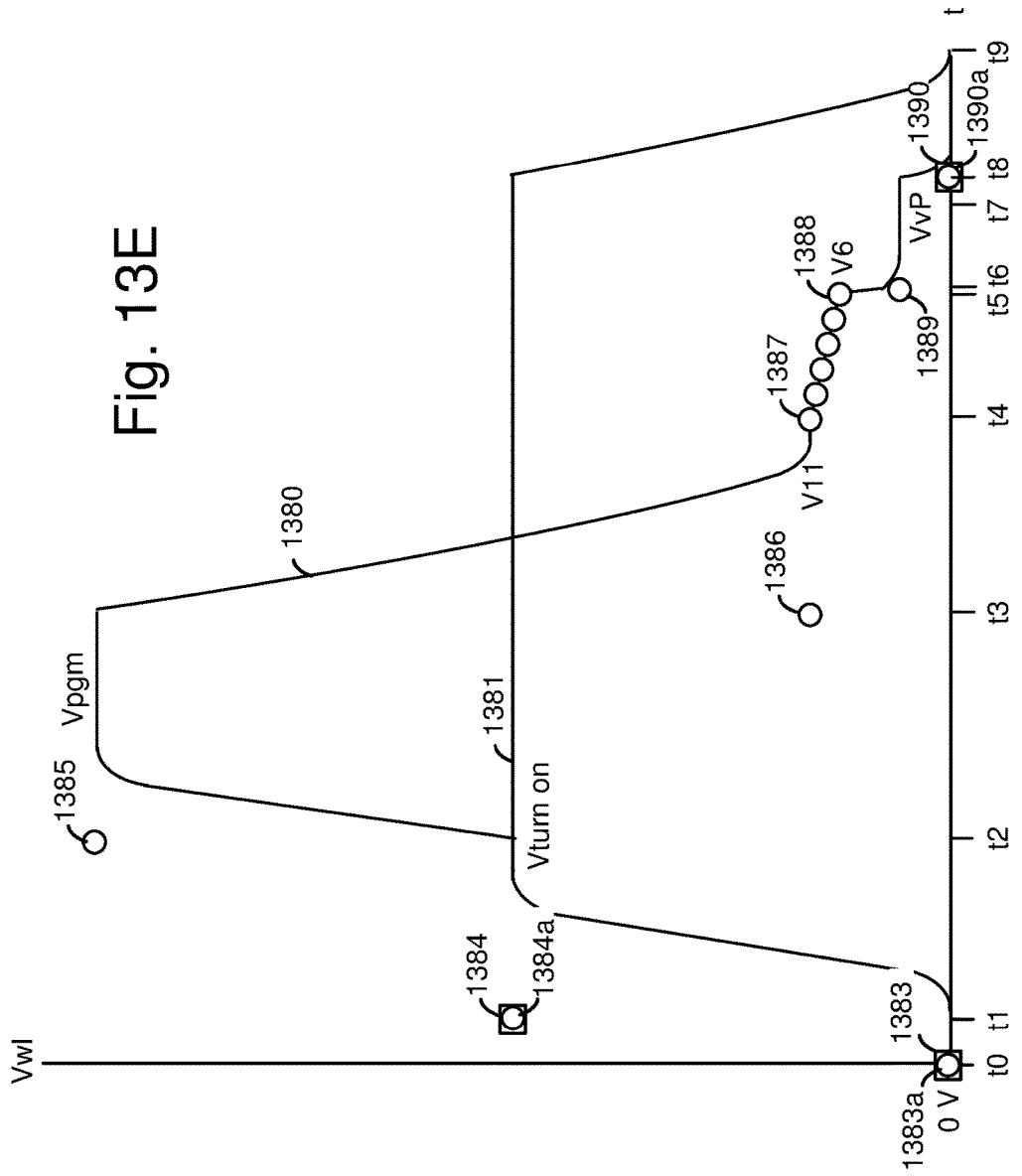

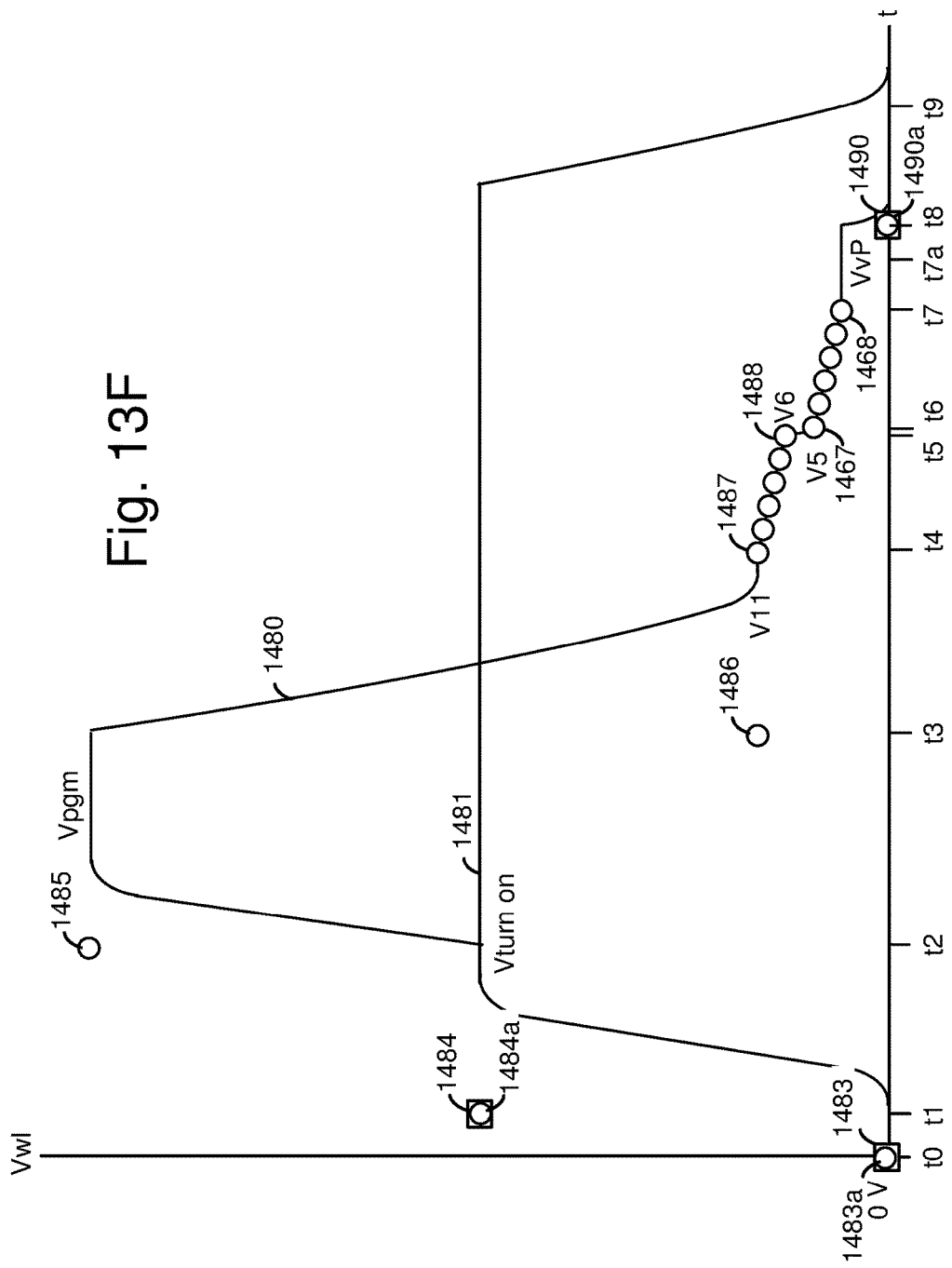

RAMP DOWN SENSING BETWEEN PROGRAM VOLTAGE AND VERIFY VOLTAGE IN MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 6A depicts an example cross-sectional view of a portion of the block BLK0 of FIG. 5.

FIG. 6B depicts an example transistor 650.

FIG. 6C depicts a close-up view of the region 622 of the stack of FIG. 6A.

FIG. 7 depicts an example view of NAND strings in a block BLK0 which is consistent with FIGS. 5 and 6A.

FIG. 9C depicts threshold voltage distributions of memory cells being programmed from the Er state to the A state, consistent with FIG. 9B, and a sensing voltage V13 used to determine an amount of programming of the memory cells.

FIG. 9D depicts threshold voltage distributions of memory cells being programmed from the Er state to the A state, consistent with FIG. 9B, including sensing voltages VvA-V16 used to determine an amount of programming of the memory cells.

FIG. 10A depicts a voltage signal used in a series of program loops in an example program operation which results in the Vth distribution of FIG. 9A.

FIG. 10B depicts a voltage signal used in a series of program loops in an example program operation which results in the Vth distribution of FIG. 9B.

FIG. 13A depicts example voltage signals applied to word lines during a program loop, where the voltages on the selected and unselected word lines are decreased to 0 V between the program voltage and the verify voltages, as a comparative example to steps 1104 and 1104$a$ of the programming process of FIG. 11A.

FIG. 13B depicts example voltage signals applied to word lines during a program loop, consistent with FIG. 11A and step 1104, where the selected word line voltage decreases from the program voltage to the lowest verify voltage of multiple verify voltages without performing ramp down sensing, consistent with FIG. 9B.

FIG. 13C depicts example voltage signals applied to word lines during a program loop, consistent with FIG. 11A and step 1104$a$, where the selected word line voltage decreases from the program voltage to a verify voltage while ramp down sensing is performed to detect a lower tail of a Vth distribution, consistent with FIG. 9A, voltages VvP-V5, or an upper tail of a Vth distribution, consistent with FIG. 9D, voltages VvA-V16.

FIG. 13D depicts example voltage signals applied to word lines during a program loop, consistent with FIG. 11A and step 1104a, where the selected word line voltage decreases from the program voltage while ramp down sensing is performed to detect a lower tail of a Vth distribution, or an upper tail of a Vth distribution, consistent with FIG. 9D, voltages VvA-V16, and no verify test is performed or the final sense result is used as the verify result, consistent with FIG. 9A, voltages VvP-V5.

FIG. 13E depicts example voltage signals applied to word lines during a program loop, consistent with FIG. 11A and step 1104a, where the selected word line voltage decreases from the program voltage to a verify voltage while ramp down sensing is performed to detect an upper tail of a Vth distribution, consistent with FIG. 9A, voltages V6-V11.

FIG. 13F depicts example voltage signals applied to word lines during a program loop, consistent with FIG. 11A and step 1104a, where the selected word line voltage decreases from the program voltage to a verify voltage while a first sequence of ramp down sensing is performed to detect an upper tail of a Vth distribution, consistent with FIG. 9A, voltages V6-V11, and a second sequence of ramp down sensing is performed to detect a lower tail of a Vth distribution, consistent with FIG. 9A, voltages VvP-V5.

DETAILED DESCRIPTION

Figure 1:
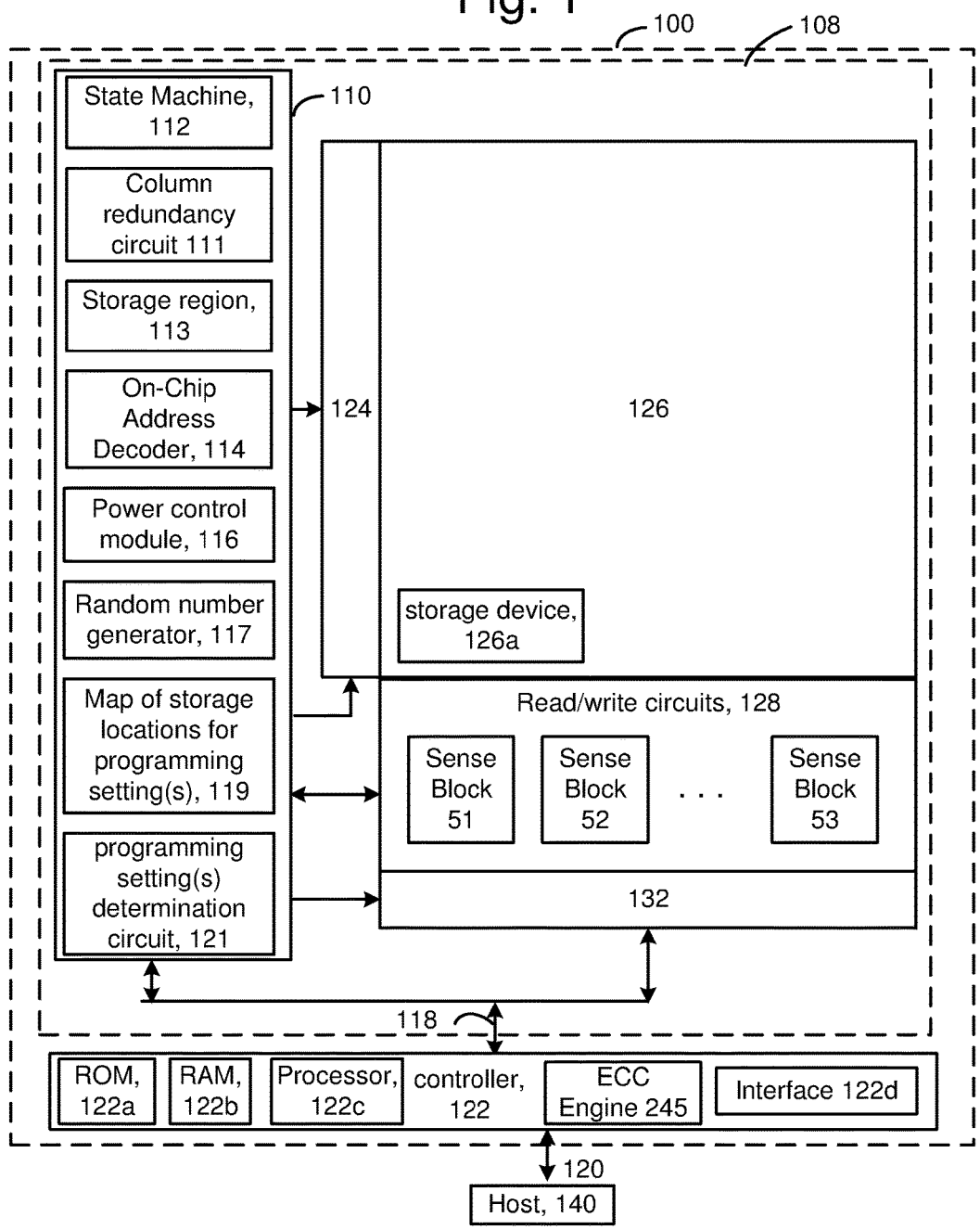
FIG. 1 is a block diagram of an example memory device.

Apparatuses and techniques are described for optimizing a program operation in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10B. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a one bit per cell memory device, also referred to as SLC, or single level cell, there are two data states including the erased state and the programmed state. See FIG. 9A. MLC or multi-level cells store two or more bits per cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9B). In a four-bit per cell memory device, there are sixteen data states including the erased state and fifteen higher data states. The data states may be referred to as the S0-S15 data states where S0 is the erased state.

SLC programming is fast and has high endurance, although the storage density is lower than when multiple bits are stored in each memory cell. Regarding program speed, the SLC programming can be performed using only one program pulse in many cases. Read speed is also high because only one read voltage is needed and error correction can be simplified due to a wide margin between the two data states. Regarding endurance, data programmed by SLC programming can be read back accurately after many read cycles because there is a wider margin between the erased and programmed data states compared to MLC programming SLC programming can therefore be used for applications in which program and read speed, and endurance, are of highest concern. For example, a set of SLC memory cells can be used as a cache between DRAM and a set of MLC memory cells. An external controller can quickly program data to a block of the SLC memory cells, and this data can be subsequently transferred to a block of MLC memory cells while the external controller performs another task. High endurance is important when the data is read many times in repeated read cycles, such as data stored in a server.

After the memory cells are programmed, the data can be read back in a read operation. A read operation can involve applying one read voltage, a series of read voltages, to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, the voltages of the unselected word lines are ramped up to a read pass level which is high enough to place the unselected memory cells in a strongly conductive state, to avoid interfering with the sensing of the selected memory cells.

However, for SLC or MLC, the program performance changes over time as the memory device is used. For example, the gate oxide of the memory cells can degrade, making it easier to program the memory cells. This can result in over-programming if the program voltages are not adjusted. If the program voltages are too high, this will result in read and verify failures in a NAND string because the unselected memory cells cannot be fully turned on to perform sensing for a selected memory cell.

Techniques provided herein address the above and other issues. In one aspect, the threshold voltage (Vth) of a set of memory cells is evaluated by repeatedly sensing the memory cells during a program loop, between the program voltage and a verify voltage. The repeated sensing can occur when the voltage of the selected word line decreases from the program voltage to the verify voltage, for instance. This minimizes any additional time which may be used in performing the repeated sensing. Further, the repeated sensing can identify an upper or lower tail of a Vth distribution, for example. The position of the tail can indicate a programming performance of the memory cells such as in terms of a degree of over programming, and this information can be used to adjust programming setting(s), such as an initial program voltage, in a subsequent program operation. The programming setting(s) can therefore be adjusted to optimize the performance of the memory device. The programming setting(s) can be stored in a storage location for use in a subsequent program operation. In some cases, the programming setting(s) can be used to adjust the remainder of a current program operation.

In one approach, a predetermined number of sense times, during which sensing occurs, are set during the decreasing voltage. In another approach, the sensing stops based on results of previous sensing during the decreasing voltage. For example, the sensing may stop when the tail is detected. This saves time by avoiding additional sensing operations and instead directly driving the voltage directly to the verify voltage or other final voltage. Additionally, there is an option for the repeated sensing to be replaced by single sensing during the decrease of the selected word line voltage.

The selected word line voltage can be decreased at a first rate to an intermediate level which is between the program voltage and the verify voltage, before being ramped down at a controlled, second rate which is less is magnitude than the first rate. The repeated sensing may occur during the ramp down at the second rate but not during the decrease at the first rate. In some cases, the intermediate level can be set adaptively as a function of the programming setting(s).

In another aspect, no verify voltage is applied and no verify test is performed in a program loop so that the selected word line voltage is decreased to a final level such as 0 V after the sensing rather than to a verify voltage.

In another aspect, the programming setting(s) for a set of memory cells can be stored in a storage location which comprise transistors including select gate transistors and/or dummy memory cells in spare NAND strings of a block. These are transistors which are not subject to erase in a block erase operation. Also, the programming setting(s) can be maintained when the memory device is powered off, in contrast to other storage components such as registers. The programming setting(s) can be read using a map which associates a storage location with a word line, for example. The data can be stored for each word line, a group of word lines, each sub-block, each block or for other groups of memory cells. The programming setting(s) is read before a program operation, and used to set an optimal program parameter such as an initial program voltage for the program operation.

Further, the repeated sensing to obtain updated programming setting(s) can be done periodically, such as in one of every N program operations, where N is a number such as 256, 512 or 1028. In one approach, a random number generator is used at the start of a program operation to determine if the sensing will be performed. In some cases, the sensing is performed in one or more program loops of a program operation.

In another aspect, the voltage on the unselected word lines remains at a turn on voltage during the program loop including during the program voltage, the decrease of the selected word line voltage, the repeated sensing and the verify voltage. This avoids a delay with decreasing the voltage on the unselected word lines from the program voltage to 0 V and then increasing the voltage on the unselected word lines from 0 V to the verify voltage.

In another aspect, the evaluation of the memory cells and the optimization of the programming setting(s) can be done using on-chip control circuitry without support from an external controller. In another aspect, the evaluation and optimization can be done for memory cells of a block, a sub-block, a word line, or a portion of a word line.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, a power control module 116 (power control circuit), a random number generator 117, a map 119 of storage locations for programming setting(s) and a programming setting(s) determination circuit 121. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. See also FIGS. 8C and 8D. The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The random number generator 117 may be used to generate a random number for use in deciding whether to evaluate the performance of a set of memory cells during a program operation, or during a program loop. See also FIG. 11A, step 1100a. The random number generator 117 may alternatively be provided in the controller 122. The map 119 may be used to store data which identifies locations in the memory structure 126 in which programming setting(s) is stored for optimizing the performance of a set of memory cells. For example, the map may associate a set of memory cells connected to a word line with an initial program voltage for use in a program operation. The storage location may be one or more particular spare NAND strings in a spare area of a block.

Figure 11A:
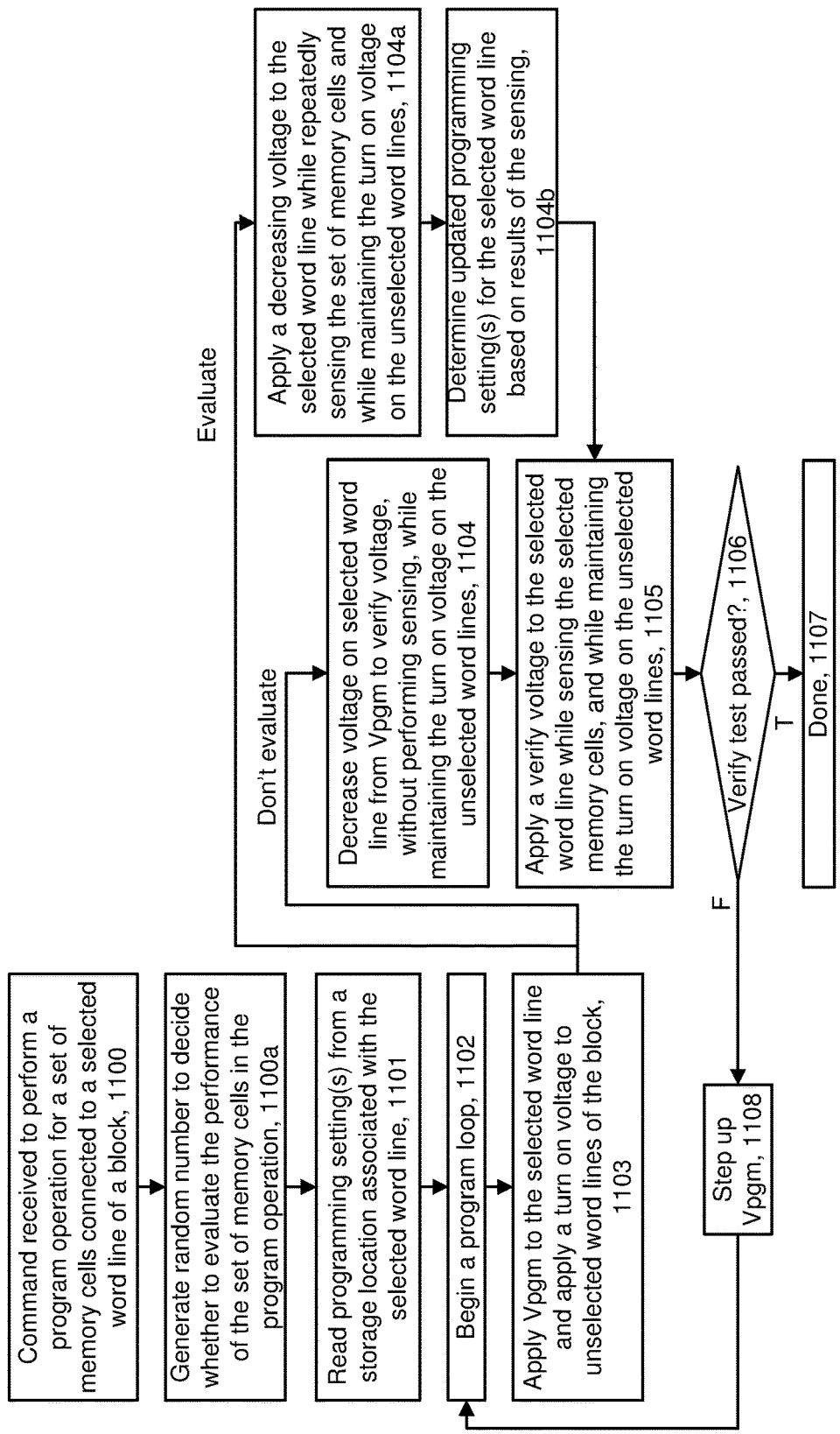
FIG. 11A depicts an example programming process with an option for sensing a set of memory cells while decreasing a voltage of a selected word line from a program voltage to a verify voltage.
Figure 11C:
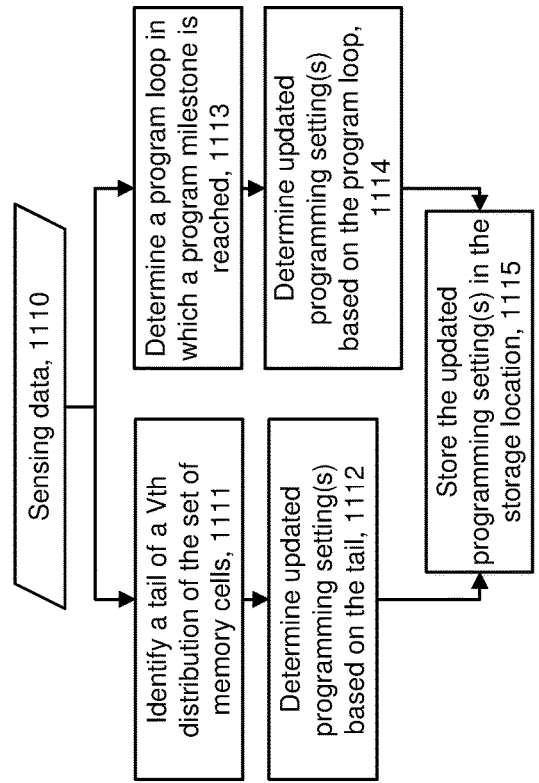
FIG. 11C depicts an example process for determining updated programming setting(s) based on sensing data as described in step 1104$b$ of FIG. 11A.
Figure 11B:
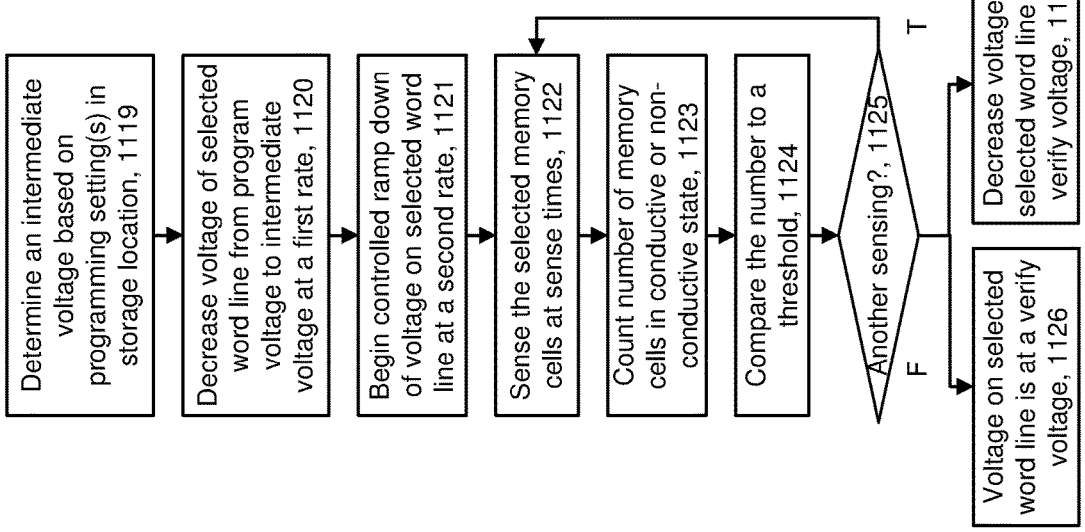
FIG. 11B depicts an example process for sensing a set of memory cells while decreasing a voltage of a selected word line as described in step 1104$a$ of FIG. 11A.
Figure 11D:
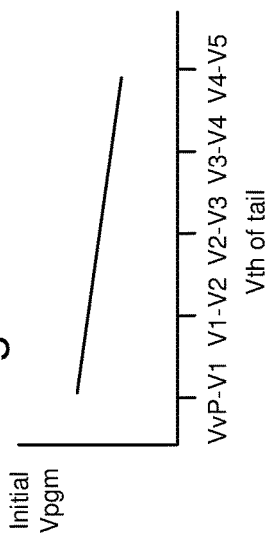
FIG. 11D depicts a plot of an initial Vpgm versus the detected tail of a Vth distribution of a set of memory cells, in an example implementation of step 1112 of FIG. 11C.
Figure 11E:
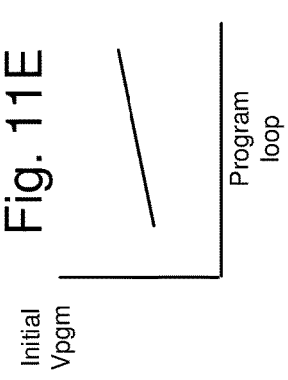
FIG. 11E depicts a plot of an initial Vpgm versus a loop number in which a set of memory cells reaches a program milestone, in an example implementation of step 1114 of FIG. 11C.

The programming setting(s) determination circuit 121 may be configured with hardware, firmware and/or software for determining updated programming setting(s) based on sensing data, such as by implementing the correlations in FIGS. 11D and 11E.

Examples of programming setting(s) include initial program voltage, program voltage step size, program voltage duration, voltage settling time, maximum allowed program voltage, and bit line and source line voltages to use during program voltages. Moreover, in addition to programming setting(s), other types of data can be stored for optimizing the performance of a set of memory cells, such as optimal read voltages and optimal turn on voltages for unselected word lines. The map 119 may therefore provide a cross-reference between different sets of memory cells and different respective storage locations which store respective programming setting(s) or other respective control parameters.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

Figure 11F:
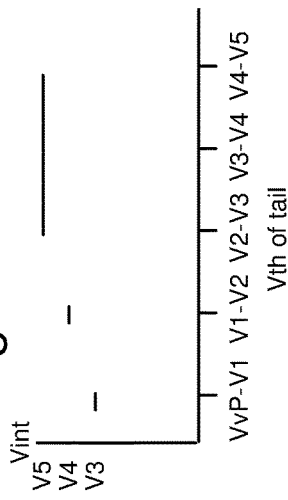
FIG. 11F depicts a plot of an intermediate voltage (Vint) versus a lower tail of a Vth distribution of a set of memory cells, in an example implementation of step 1119 of FIG. 11B.

The controller 122 or control circuitry 110 can be configured with hardware, firmware and/or software for implementing the plots of FIGS. 11D-11F, and other processes including the processes of the flowcharts described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
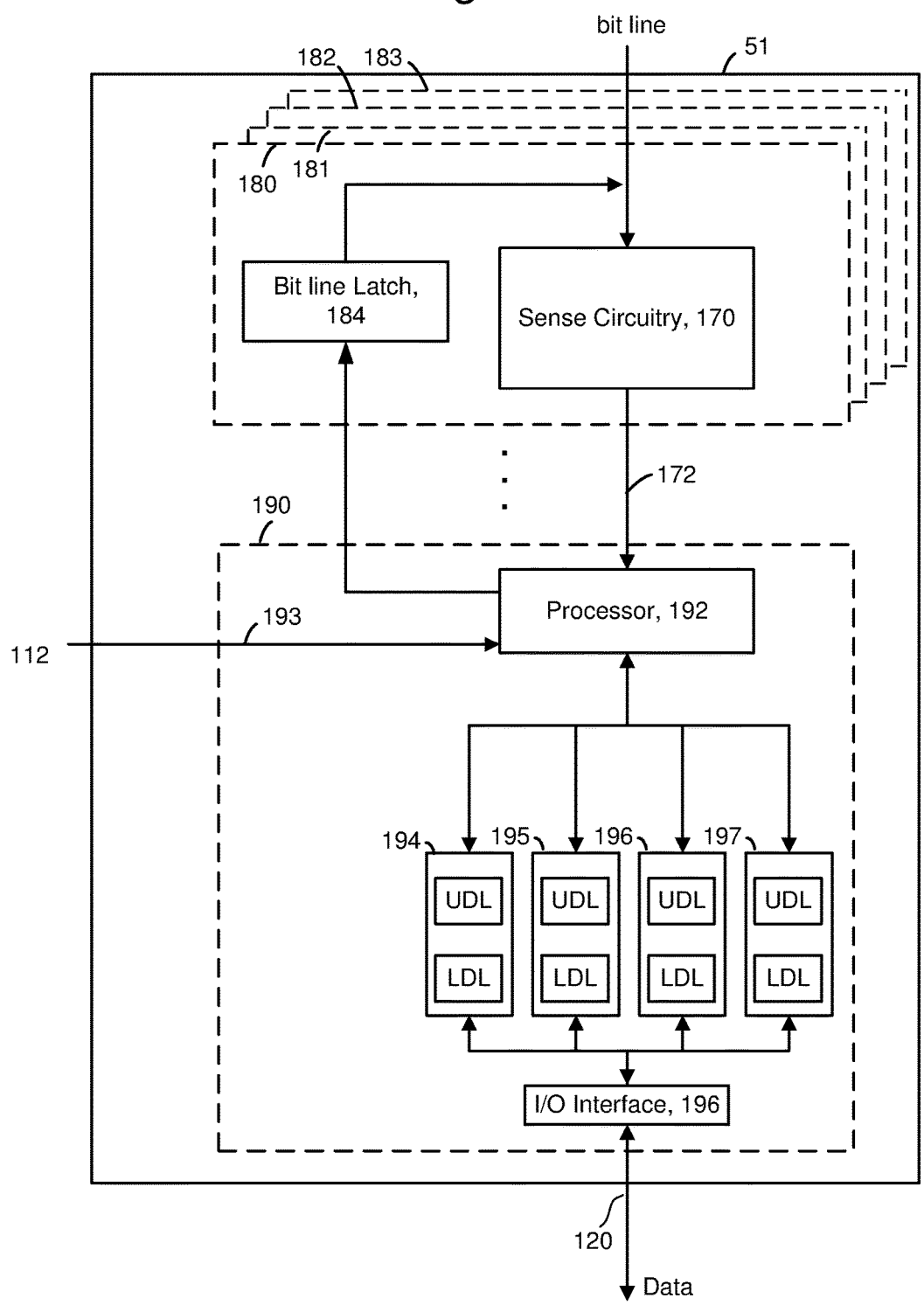
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. For example, during the ramp down sensing described herein, at each sense time, the sense circuits detect a voltage on the bit lines of the NAND strings being sensed. In one approach, when a memory cell is conductive, the bit line voltage discharges below a trip voltage at a specified time after the sense time. If the bit line voltage does not discharge below the trip voltage, the memory cell is considered to be non-conductive. See also FIG. 11B regarding the sensing of the lower or upper tail of the Vth distribution.

Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
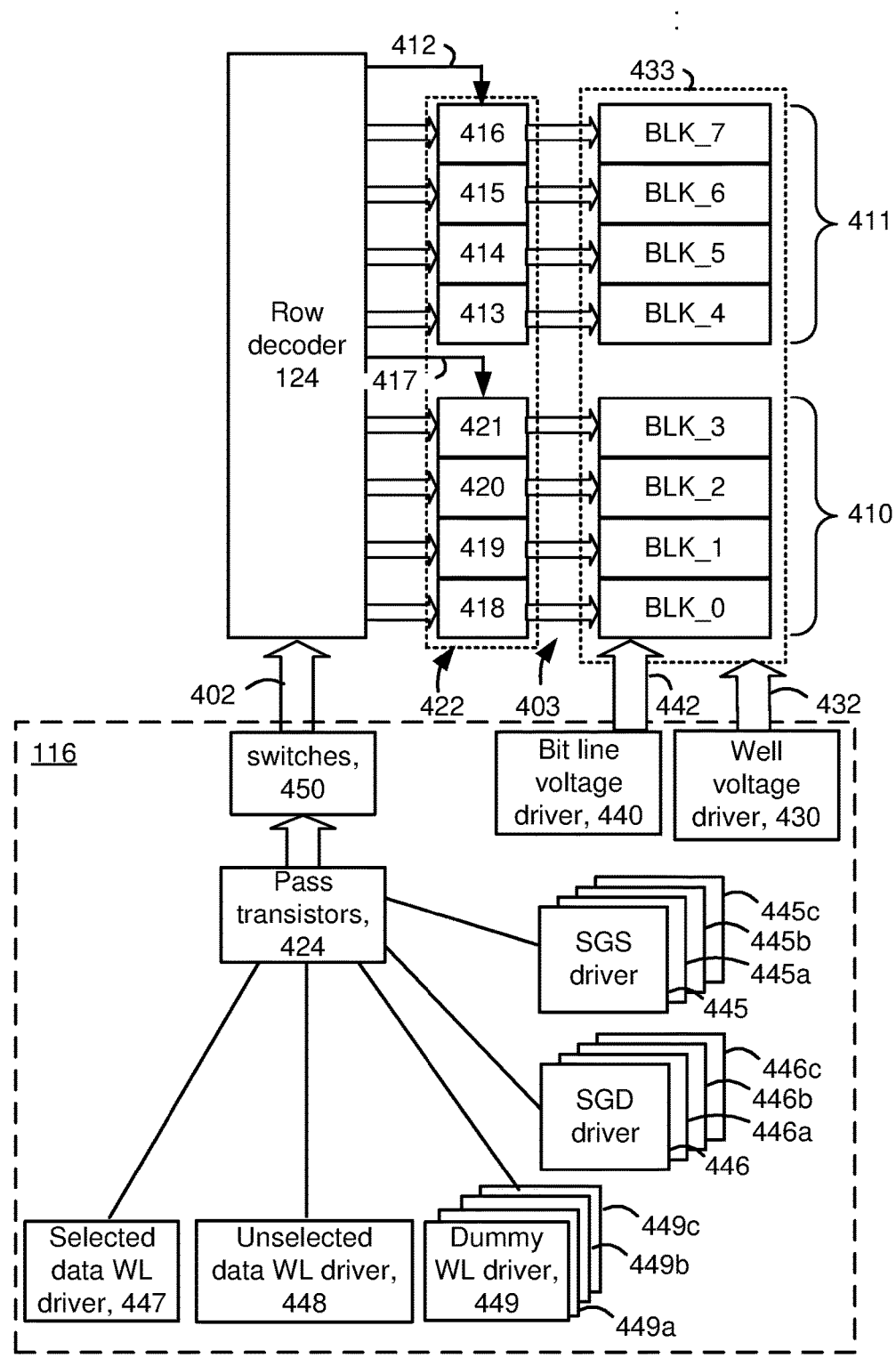
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 6A, during a refresh operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8A and 8B. In another option, one SGS driver is common to the different sub-blocks in a block. Moreover, in some cases, such as a depicted in FIGS. 7, 8B and 8D, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 5 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figures 4A, 4B, 5:
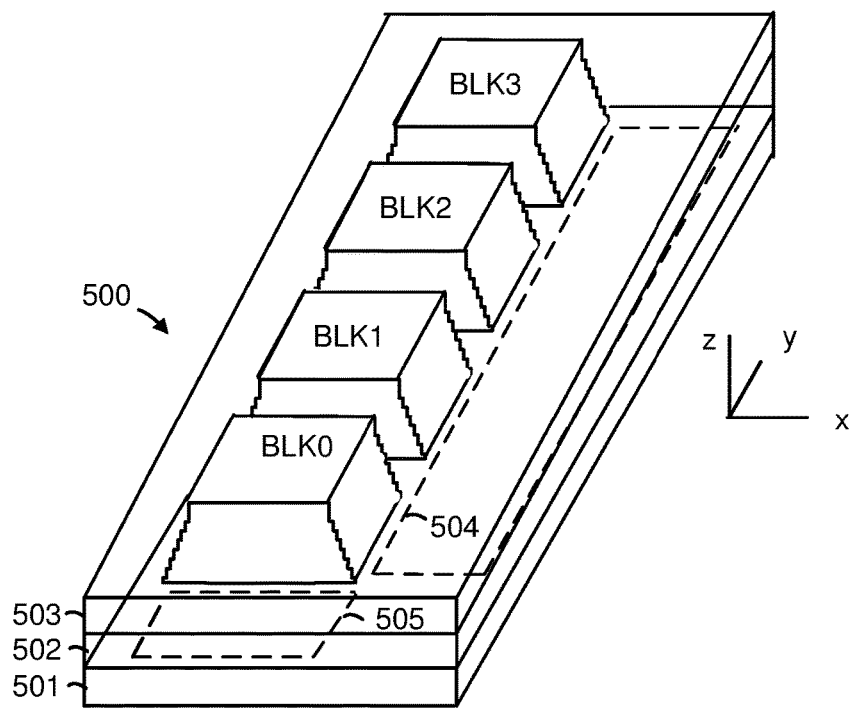
FIG. 4A depicts an example of the map 119 of FIG. 1.
FIG. 4B depicts an example of programming setting(s) stored in a storage location referenced by the map 119 of FIG. 4A.
FIG. 5 is a perspective view of a memory device 500 comprising a set of blocks in an example 3D configuration of the memory structure 126 of FIG. 1.

FIG. 4A depicts an example of the map 119 of FIG. 1. As mentioned, the map can store data which cross-references different sets of memory cells to different respective storage locations which store respective programming setting(s). In one approach, each word line such as WL0, WL1, WL2, WL3 . . . is cross-referenced to a spare NAND string (NS) such as NS 704n, 705n, 706n, 707n, . . . in FIG. 8D. The storage location for a word line could be in one or more spare NAND strings, and in one or more transistors of the spare NAND strings, for instance. The transistors used for storing the programming setting(s) may include dummy memory cells and selected gate transistors, which are not normally erased in a block erase operation. This allows the programming setting(s) to be stored across multiple program and erase cycles of a block. In contrast, data memory cells are typically erased in a block erase operation. Moreover, by using spare NAND strings to store the programming setting(s), there is no lost capacity in the primary NAND strings. The number of spare NAND strings used may be a small portion of all spare NAND strings so that the overhead cost is acceptable. Once the dummy memory cells and/or select gate transistors of a spare NAND string are used to store programming setting(s), the remaining data memory cells of the spare NAND string may be unavailable to store data, in one approach. The remaining spare NAND strings may be used to replace primary NAND strings which are found to be defective. The column redundancy circuit 111 (FIG. 1) may be used to map the defective primary NAND strings to available spare NAND strings.

By programming the programming setting(s) into multiple dummy memory cells and/or select gate transistors of a spare NAND string, the number of spare NAND strings used can be minimized. To further reduce overhead costs, multiple bits of programming setting(s) can be stored in each dummy memory cell and/or select gate transistor. Or, for greater reliability and write/read speed, a single bit of programming setting(s) can be stored in each dummy memory cell and/or select gate transistor. See also FIG. 12.

The map 119 can also cross-reference a set of memory cells to a portion of a NAND string or to multiple NAND strings. For example, one entry of the map could cross-reference WL0 to the drain-side dummy memory cells and/or select gate transistors of NS 704n (see, e.g., the dummy memory cells 885 and 886 and the select gate transistors 887 and 888 of FIG. 8D), and another entry of the map could cross-reference WL1 to the source-side dummy memory cells and/or select gate transistors of NS 704n (see, e.g., the dummy memory cells 882 and 883 and the select gate transistors 880 and 881 of FIG. 8D). In another example, one entry of the map could cross-reference WL0 to the drain-side dummy memory cells of NS 704n and 705n (see, e.g., the dummy memory cells 885 and 886 in NS 704n and the dummy memory cells 891 and 892 in NS 705n). Another entry of the map could cross-reference WL1 to the drain-side select gate transistors of NS 704n and 705n (see, e.g., the SGD transistors 887 and 887 in NS 704n and the SGD transistors 893 and 894 in NS 705n).

FIG. 4B depicts an example of programming setting(s) stored in a storage location referenced by the map 119 of FIG. 4A. In this example, the storage locations are NAND strings (NS) such as NS 704n, 705n, 706n, 707n, . . . which store an initial program voltages such as 15 V, 15.5 V, 16 V and 15V, respectively. The initial program voltages are one example of programming setting(s) and can be represented by different sets of bits. Each set of bits may be correlated by the on-chip circuitry to an initial program voltage. A set of bits may include 4 bits or 8 bits (one byte), for example.

The number of different initial program voltages will be a function of the number of bits allocated to the programming setting(s). In one approach, the programming setting(s)

identifies more than one type of data. For example, a byte of programming setting(s) may be stored where the first and second halves of the byte represent first and second types of programming setting(s), respectively. In one example, the first and second types of programming setting(s) are an initial program voltage and a step size, respectively, or an initial program voltage and a program voltage duration, respectively.

FIG. 5 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 6A depicts an example cross-sectional view of a portion of the block BLK0 of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises a well region 611a as an n-type source diffusion layer or well in the substrate.

The well region is in contact with a source end of each string of memory cells in a block. An erase pulse may be applied to this layer in an erase operation. The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in the block BLK0 which is consistent with FIGS. 5 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 8A:
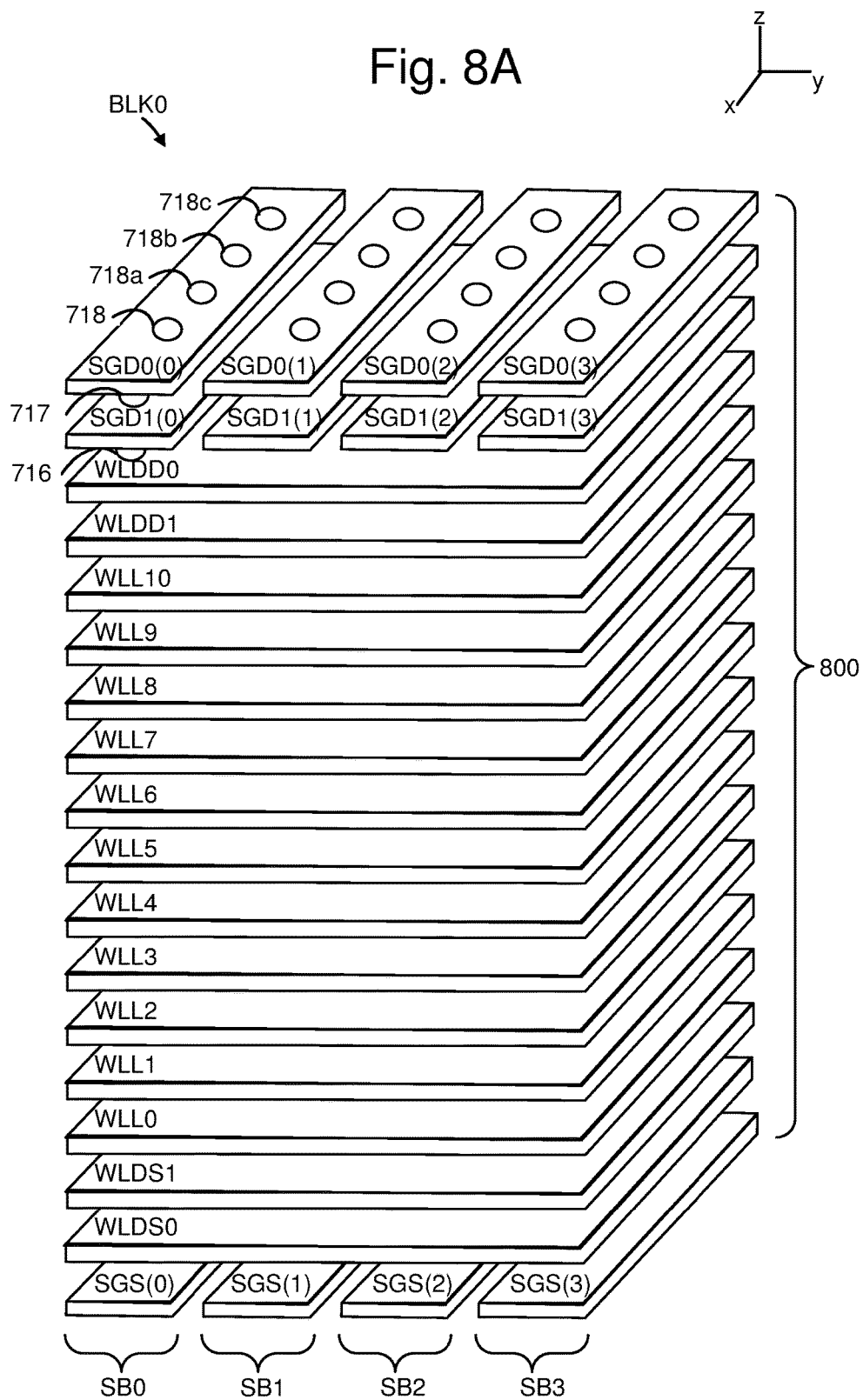
FIG. 8A depicts control gate layers in the block BLK0 consistent with FIG. 7.

FIG. 8A depicts control gate layers in the block BLK0 consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

Figure 8B:
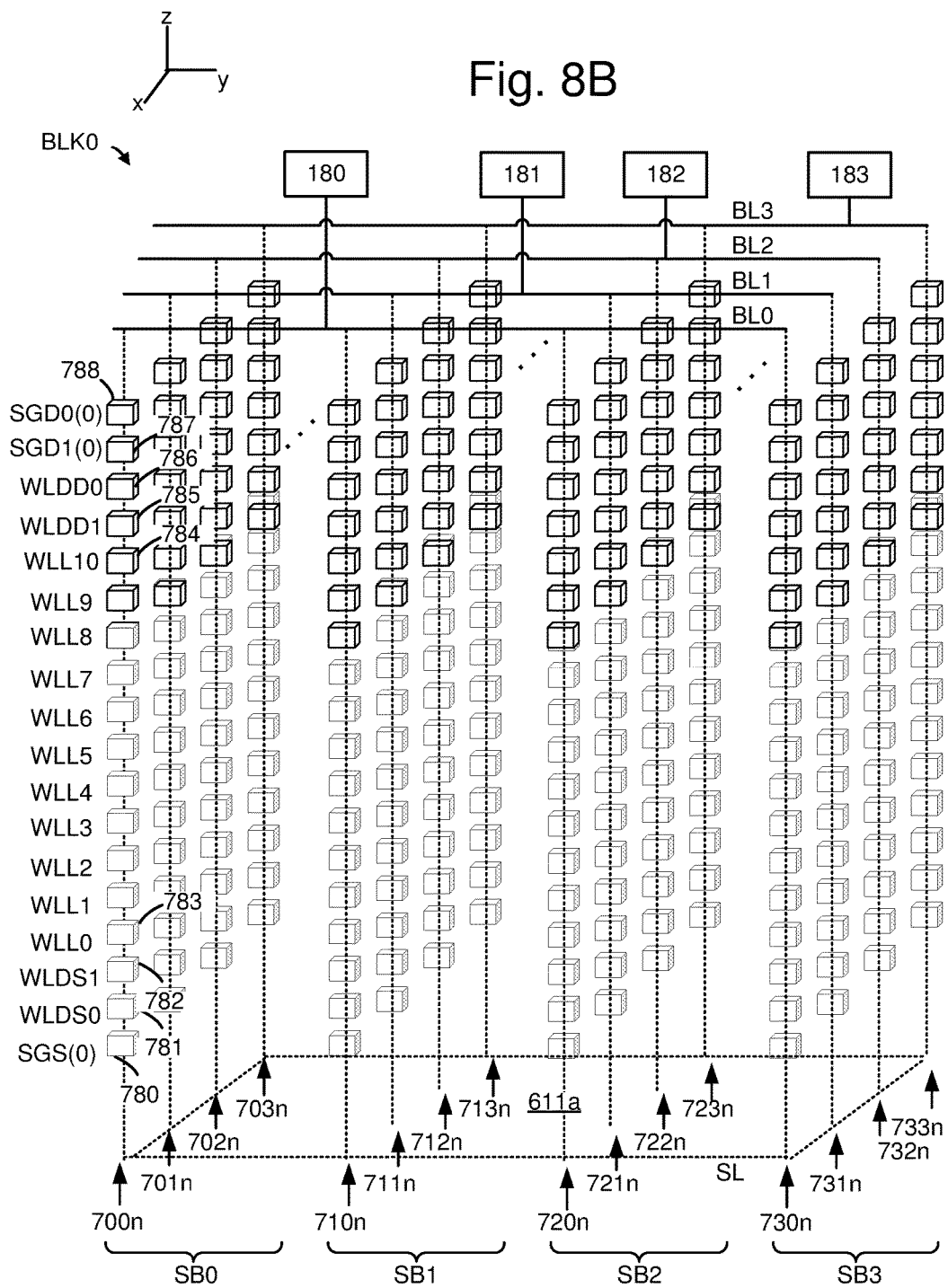
FIG. 8B depicts additional detail of the block BLK0 of FIG. 7.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells, which includes an example memory cell 734, is connected to WLL10 in SB1.

In this example, the source line SL or source region (well region 611a) is driven at a voltage Vsource.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven.

The NAND string 700n includes SGD transistors 788 and 787 connected to select gate lines SGD0(0) and SGD1(0), respectively, dummy memory cells 786 and 785 connected to WLDD0 and WLDD1, respectively, and data memory cell 784 connected to WLL10.

Figure 8C:
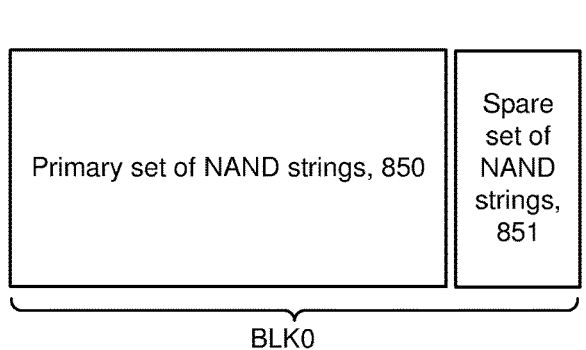
FIG. 8C depicts a division of the block BLK0 of FIG. 8B into a primary set of NAND strings 850 and a spare set of NAND strings 851.

FIG. 8C depicts a division of the block BLK0 of FIG. 8B into a primary set of NAND strings 850 and a spare set of NAND strings 851. As mentioned, spare NAND strings may be used to replace defective primary NAND strings according to a mapping of the column redundancy circuit (FIG. 1). The defects, e.g., short circuits, may be detected at the time of manufacture, for instance, or during the use of the memory device by the end user. Some of the techniques described herein can use the spare NAND strings to store programming setting(s) for sets of memory cells.

Figure 8D:
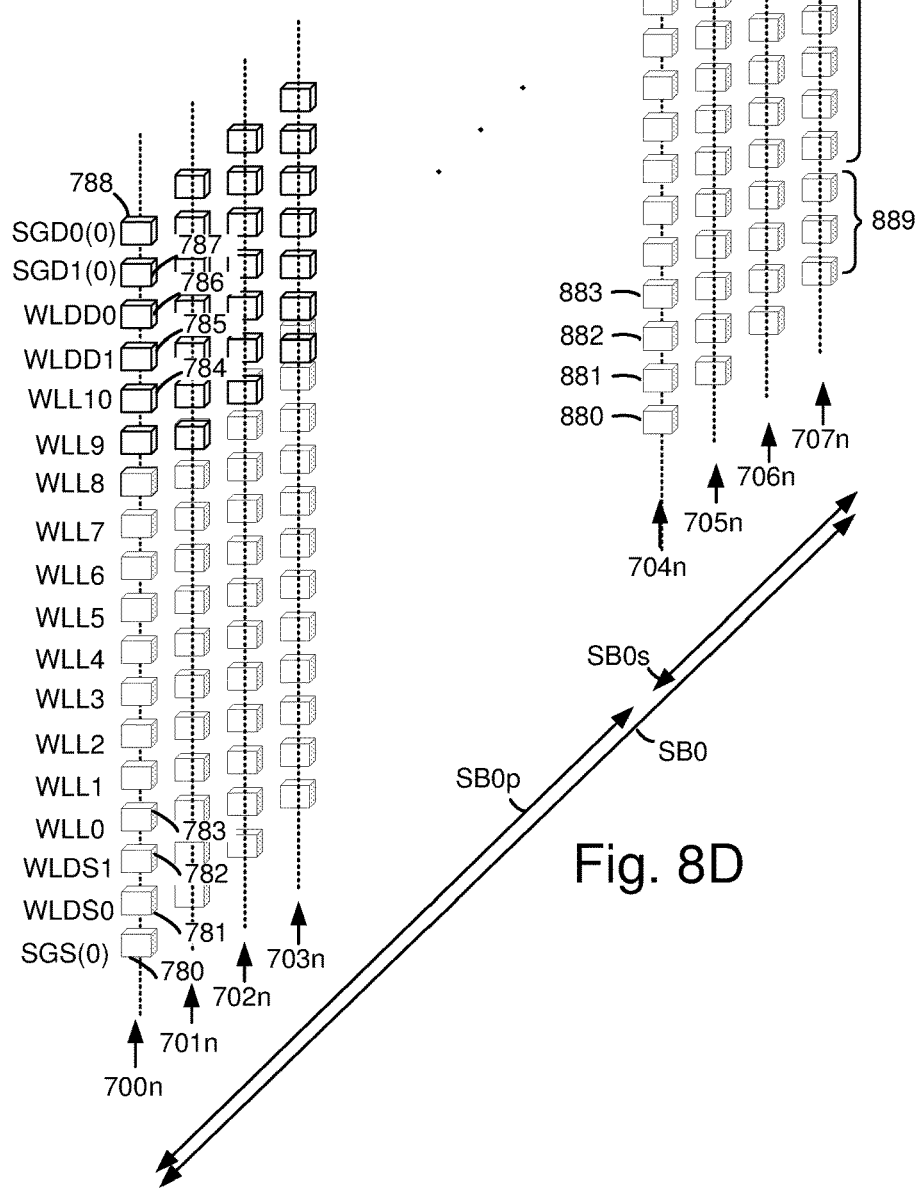
FIG. 8D depicts additional detail of SB0 of FIG. 8B, consistent with FIG. 8C, including a primary set of NAND strings SB0$p$ and a spare set of NAND strings SB0$s$.

FIG. 8D depicts additional detail of SB0 of FIG. 8B, consistent with FIG. 8C. Similar to the way the block is divided in FIG. 8C, SB0 can be divided into a primary set of NAND strings SB0p and a spare set of NAND strings SB0s. The primary set of NAND strings in SB0 includes the NAND strings 700n-703n discussed in connection with FIG. 8A. The spare set of NAND strings in SB0 includes NAND strings 704n-707n. The spare NAND strings include drain-side transistors 890 including dummy memory cells and SGD transistors, source-side transistors 889 including dummy memory cells and SGS transistors, and data memory cells 895. In one approach, as mentioned, the drain-side transistors and source-side transistors can be used to store programming setting(s) for optimizing the programming of different sets of memory cells.

The NAND string 704n includes example data memory cells 883 and 884 (connected to WLL0 and WLL10, respectively), dummy memory cells 881, 882, 885 and 886 (connected to WLDS0, WLDS1, WLDD1 and WLDD0, respectively), SGS transistor 880 (connected to SGS(0), and SGD transistors 887 and 888 (connected to SGD1(0) and SGD0 (0), respectively). The NAND string 705n includes example dummy memory cells 891 and 892 (connected to WLDD1 and WLDD0, respectively), and example SGD transistors 893 and 894 (connected to SGD1(0) and SGD0(0), respectively).

Figure 9A:
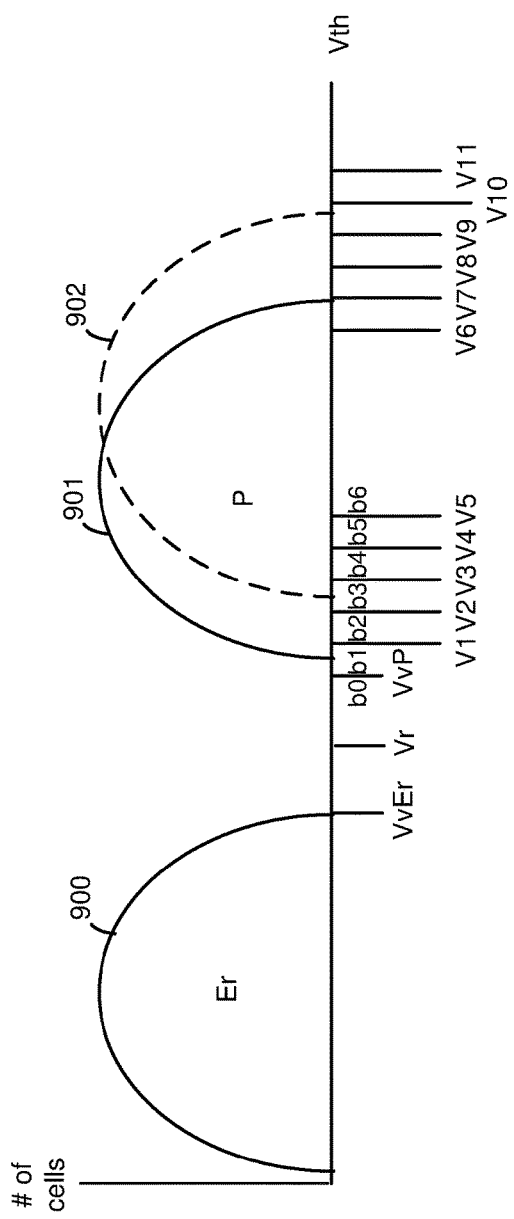
FIG. 9A depicts a threshold voltage (Vth) distribution of SLC memory cells in an erased (Er) state and a programmed (P) state, including an example of over programming and sensing voltages used to determine an amount of the over programming.

FIG. 9A depicts a threshold voltage (Vth) distribution of SLC memory cells in an erased (Er) state (Vth distribution 900) and a programmed (P) state (Vth distributions 901 and 902), including an example of over programming (Vth distribution 902) and sensing voltages used to determine an amount of the over programming. In FIG. 9A-9D, the vertical axis depicts a number of memory cells on a logarithmic scale and the horizontal axis depicts the Vth on a linear scale. Initially, a block of memory cells is erased and the memory cells are in the Er state. The erase operation may use the erase-verify voltage VvEr to provide the Vth distribution 900. Subsequently, when a program operation is performed, some of the memory cells remain in the Er state while others are programmed to the P state in one or more program loops. The program operation may use the program-verify voltage VvP to provide the Vth distribution 901 for a fresh memory device. However, for a cycled memory device, the memory cells become easier to program so that the Vth distribution 902 is obtained. This Vth distribution is upshifted and widened compared to the Vth distribution 901.

In this example, the memory cells are SLC cells which are programmed in one or two program loops, e.g., using one or two program voltages or pulses such as by using the voltage signal of FIG. 10A. For example, assume the Vth distributions 901 and 902 are both obtained after one program pulse. A verify test may be performed after the first program pulse to ensure that the Vth exceeds VvP. If the Vth does not exceed VvP, a second program pulse can be applied. The SLC cells thus can be programmed very quickly. As mentioned at the outset, the upper or lower tail of a Vth distribution can be sensed in a ramp down sensing process which occurs between a program voltage and a verify voltage. For example, the memory cells can be sensed using the voltages VvP-V5 (VvP, V1, V2, V3, V4 and V5) to detect the lower tail of the Vth distributions 901 or 902, and using the voltages V6-V11 (V6, V7, V8, V9, V10 and V11) to detect the upper tail of the Vth distributions 901 or 902. The tail of a Vth distribution can be classified according to the voltage range in which it falls. For example, the lower tails of the Vth distributions 901 and 902 fall in the voltage ranges of VvP-V1 and V2-V3, respectively, and the upper tails of the Vth distributions 901 and 902 fall in the voltage ranges of V6-V7 and V9-V10, respectively.

A sequence of bits b0-b6 which may be used to encode a sensing result which identifies the lower tail of the Vth distribution 902, for instance. Each bit is associated with a voltage range and may be a 1 or 0 to indicate whether the tail is above or below the associated range. For example, b0-b2 may be 1 to indicate that tail of the Vth distribution 902 is above the associated ranges of <VvP, VvP-V1 and V1-V2, respectively, and b3-b6 may be 0 to indicate that tail is not above the associated ranges of V2-V3, V3-V4, V4-V5, and >V5, respectively. The tail is therefore in the lowest of these associated ranges (V2-V3). Another option is for one bit to be set to 1 when the tail falls in the associated range and for the other bits to be set to 0, for instance. For example, b0, b1, b2, b4, b5 and b6=0 and b3=1. The tail is therefore in the associated range of b3 (e.g., V2-V3).

By analyzing the Vth distribution, the programming setting(s) for the associated memory cells can be adjusted and adapted as the performance of the memory device changes. For example, if the over programming increases as the memory device is cycled, the initial program voltage and/or program pulse duration can be reduced to reduce the over programming in a subsequent program operation. In some cases, the sensing may reveal that the Vth distribution has shifted lower over time, and the programming setting(s) can be adjusted accordingly such as by increasing the initial program voltage and/or program pulse duration in a subsequent program operation.

The number of sensing voltages (e.g., control gate or word line voltages used during sensing) can be decided based on various criterion, including the desired number of potential adjustments to the programming setting(s). If a higher adjustment granularity is desired, a larger number of sensing voltages can be used. In one approach, the sensing voltages are equally spaced apart, although unequal increments could alternatively be used. Also, the time increment between successive sense operations can be equal or unequal. When both upper and lower tails are sensed (See FIG. 13F), the number of sensing voltages, and the spacing between them, can be equal or different for the upper versus the lower tail.

In FIG. 9A, the voltages VvP-V5 and V6-V11 are examples of evaluation voltages.

Figure 9B:
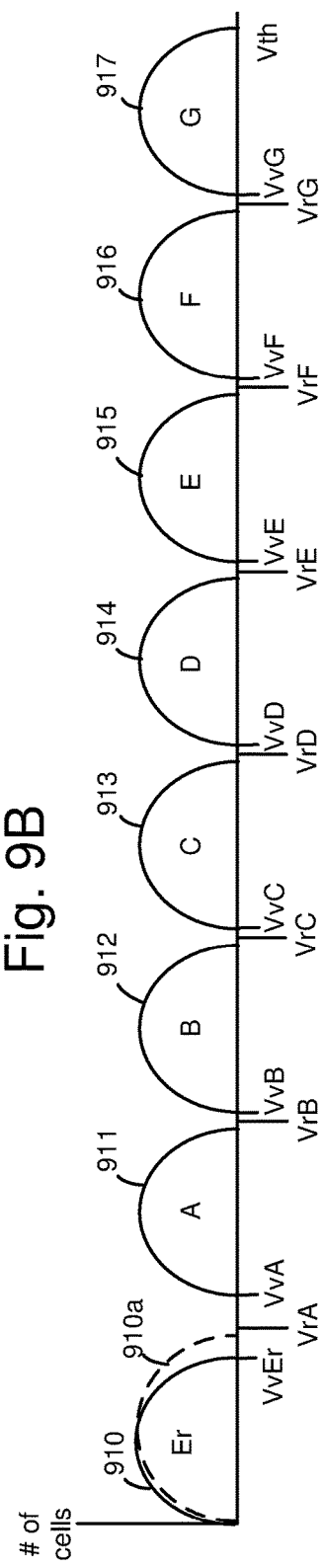
FIG. 9B depicts an example Vth distribution of a set of memory cells in eight data states.

FIG. 9B depicts an example Vth distribution of a set of memory cells in eight data states. In one approach, at a start of a program operation, the memory cells are all initially in the erased state as represented by the Vth distribution 910. After the program operation is successfully completed, the memory cells assigned to the Er state are represented by the Vth distribution 910a. The Vth distribution is upshifted due to program disturb.

The memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The Vth distributions are obtained just after completion of the program operation. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

FIG. 9C depicts threshold voltage distributions of memory cells being programmed from the Er state to the A state, consistent with FIG. 9B, and a sensing voltage V13 used to determine an amount of programming of the memory cells. Instead of the multiple sensing voltages of FIG. 9A, a single sensing voltage V13 can be used to evaluate the performance of a set of memory cells and to characterize the Vth distribution. In this example, the memory cells are programmed from the Er state Vth distribution 910 to the Vth distributions 920 and 921 after first and second program pulses, respectively, of a program operation. The Vth distribution 911 may be achieved after additional program pulses.

A sensing operation may be performed using V13 after each program pulse. A number of memory cells which have Vth>V13 can be counted and the count compared to a threshold. If the count exceeds the threshold, the memory cells are considered to have reached a program milestone. The associated program loop number (e.g., 2) can be recorded as a form of programming setting(s) which is used to optimize future programming of the memory cells. The memory cells subject to the count can include all memory cells being programmed, or the memory cells being programmed to the A state (the lowest programmed state), for example. In the case of programming MLC memory cells, it is useful to focus on the start of the program operation when all or most of the memory cells have not yet completed programming, so that the Vth distribution represents the full range of program speeds of the memory cells.

In FIG. 9C, the voltage V13 is an example of an evaluation voltage.

FIG. 9D depicts threshold voltage distributions of memory cells being programmed from the Er state to the A state, consistent with FIG. 9B, including sensing voltages VvA-V16 used to determine an amount of programming of the memory cells. This example allows the upper tail of the Vth distribution to be detected with more granularity. Multiple sensing operations can be performed between the program voltage and the verify voltage as described herein to detect the upper tail of the Vth distribution. One example approach involves detecting the upper tail after a predetermined number of program pulses or loops (e.g., 2). In this example, the Vth distribution 921 is achieved after the second program pulse and the upper tail is sensed as being between V14 and V15.

As an example, assume the Vth distributions are reached in one, two and four program loops, respectively. These loops may be a plurality of program loops of a program operation, where in each loop, a voltage driver configured to apply a program voltage followed by a decreasing voltage to a selected word line, and sense circuits are configured to perform a repeated sensing of the set of memory cells during the decreasing voltage. The repeated sensing indicates that the set of memory cells reaches a program milestone in one program loop (e.g., loop 4 of the plurality of program loops).

A control circuit can be configured to adjust programming setting(s) of a subsequent program operation based on the one program loop. Further, the program operation may include one or more additional program loops in which the Vth tail detection and repeated sensing are not performed. Generally, sense circuits are configured to perform the repeated sensing of the set of memory cells during a decreasing voltage in one program loop but not all program loops of a plurality of program loops of a program operation.

In FIG. 9D, the voltages VvA-V16 are examples of evaluation voltages.

FIG. 10A depicts a voltage signal used in a series of program loops in an example program operation which results in the Vth distribution of FIG. 9A. As mentioned, SLC programming can be fast and involve one or sometimes two program pulses, in one approach. In FIGS. 10A and 10B, the horizontal axis denotes a program loop number, and the vertical axis denotes voltage. The voltage signal 1050 includes a program pulse 1051 and program-verify voltage VvP 1052 in a first program loop, and a program pulse 1053 and program-verify voltage VvP 1054 in a second and final program loop. The voltage signal is applied to a word line which is selected for programming.

The initial program voltage and the step size can be different for the SLC programming of FIG. 10A compared to the MLC programming of FIG. 10B.

FIG. 10B depicts a voltage signal used in a series of program loops in an example program operation which results in the Vth distribution of FIG. 9B. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation. Additionally, as described herein, e.g., in FIG. 13C-13F, repeated sensing operations may occur when the selected word line voltage is ramped down between the program voltage and the verify voltage.

The voltage signal 1000 includes a series of program voltages, including an initial program voltage 1001, which are applied to a word line selected for programming In this example, the voltage signal includes program voltages which increase stepwise in amplitude in one or more program loops of a programming pass using a fixed or varying step size. This is referred to as incremental step pulse programming, where the program voltage starts at an initial level (see program voltage 1001) and increases in a step in each successive program loop, for instance, until the program operation is completed. The operation is successfully completed when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, a Vth distribution similar to that in FIG. 9B is achieved, and the data can be read from the memory cells using read voltages which are between the Vth distributions. At the same time, a read pass voltage, Vpass (e.g., 8-10 V), also referred to as pass voltage or turn on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 11A depicts an example programming process with an option for sensing a set of memory cells while decreasing a voltage of a selected word line from a program voltage to a verify voltage. In a program loop, the selected word line voltage decreases from the program voltage to the verify voltage in a transition period. Repeated sensing operations can be performed during this transition to evaluate an amount of programming of the memory cells due to the program voltage. For example, as mentioned, the sensing operations can identify an upper and/or lower tail of a Vth distribution.

At step 1100, a command is received to perform a program operation for a set of memory cells connected to a selected word line of a block. For example, the command may be received by the controller 122 from the host 140 (FIG. 1). Step 1100*a* includes generating a random number to decide whether to evaluate the performance of the set of memory cells in the program operation. For example, an eight bit random number can be generated and compared to a predetermined number, such as 11111111. If there is a match, the performance is evaluated. If there is not a match, the performance is not evaluated. With an n-bit random number, the evaluation will occur on average once every $2^n$ times the word line is programmed. For instance, with n=8, the evaluation will occur on average once every 256 times the word line is programmed. This approach is useful because it avoids the overhead costs in tracking the number of program operations for each block and/or word line. Also, one random number generator can be used to decide whether to evaluate any word line, block or other unit of memory cells in a memory device.

When an evaluation is performed, it can occur in one or more program loops. In one approach, such as with SLC programming in which programming is typically completed in one program loop, consistent with FIG. 9A, the evaluation may occur during the first program loop.

In other approaches, such as with MLC programming in which the evaluation involves determining when a set of memory cells reaches a program milestone, consistent with FIGS. 9C and 9D, the evaluation may be performed in each program loop, starting from the first program loop until the program milestone is reached. This may be in, e.g., 2-4 program loops, in the example of FIGS. 9C and 9D. The evaluation may be omitted in subsequent program loops, in one approach. In some cases, the decision of whether to perform the evaluation in a program loop may be based on a result of the evaluation in a prior program loop. For example, if a milestone is reached based on an evaluation in one program loop, the evaluation can be omitted for subsequent program loops of the program operation.

Step 1101 includes reading programming setting(s) from a storage location associated with the selected word line. The map 119 and table of FIGS. 4A and 4B, respectively, may be used in this step. Step 1102 begins a program loop. Step 1103 includes applying Vpgm to the selected word line and applying a turn on voltage to unselected word lines of the block. The turn on voltage can be applied to data word lines, dummy word lines and selected gate transistors, in one approach. Vpgm may be set based on the programming setting(s), as discussed. After step 1103, step 1104 is reached if an evaluation is not to be performed or step 1104*a* is reached if an evaluation is to be performed.

Step 1104 includes decreasing the selected word line voltage from Vpgm to a verify voltage, without performing sensing, while maintaining the turn on voltage on the unselected word lines. The turn on voltage, e.g., 8-10 V, of a word line provides the memory cells connected to the word line in a conductive state. The transition from the program voltage to the verify voltage may be direct in that it involves decreasing but not increasing the voltage. See, e.g., FIG. 13B and the plot 1320 at t3-t4. Step 1105 includes applying a verify voltage to the selected word line while sensing the selected memory cells, and while maintaining the turn on voltage on the unselected word lines. See, e.g., FIG. 13B, plots 1320 and 1321 at t4-t9. A decision step 1106 determines whether one or more verify tests have been passed, that is, whether all or nearly all of the memory cells which are subject to a respective verify test pass the respective verify test by being in a non-conductive state when sensed, indicating that their Vth is greater than the verify voltage. If decision step 1106 is false, Vpgm is stepped up at 1108 and a next program loop begins at step 1102. If decision step 1106 is true, the program operation is done at step 1107.

Step 1104*a* includes applying a decreasing voltage to the selected word line while repeatedly sensing the set of memory cells and while maintaining the turn on voltage on the unselected word lines. The transition from the program voltage to the verify voltage may be direct in that it involves decreasing but not increasing the voltage. The sensing may be referred to as ramp down sensing or decreasing ramp sensing, and allows many sensing points to be obtained quickly because the word line voltage is not stabilized for each sensing point. This provides sensing with a rough accuracy which is acceptable in evaluating the Vth distribution. In practice, a good accuracy is obtained since the sensing voltages are relatively close together and the word line voltage is ramped down at a controlled rate. See, e.g., FIG. 13C, plots 1340 and 1341 at t4-t5, FIG. 13D, plots 1360 and 1361 at t4-t5, FIG. 13E, plots 1380 and 1381 at t4-t5, and FIG. 13F, plots 1480 and 1481 at t4-t5 and t6-t7. Step 1104*b* includes determining updated programming setting(s) for the selected word line based on results of the sensing. See, e.g., FIG. 11C-11E. Step 1105 is then reached in which the verify voltage is applied. See, e.g., FIG. 13C, plot 1340 at t5-t7, FIG. 13E, plot 1380 at t6-t8, and FIG. 13F, plot 1480 at t7-t8.

In an option, during the ramp down sensing, the word line voltage can be stabilized for one or more sensing points such that the ramp down voltage on the selected word line resembles a decreasing staircase waveform, for instance.

In one approach, the programming setting(s) which was previously determined for a given set of memory cells is used in subsequent programming of the same set of memory cells. However, it is also possible for programming setting(s) which was previously determined for a first set of memory cells to be shared and used in a subsequent programming of a different, second set of memory cells. This may be done when the first and second sets of memory cells are expected to have a similar program performance. For example, a program operation for a block may program the memory cells connected to a word line in a first sub-block (e.g., WLL0 in SB0, FIG. 7), but not the memory cells connected to the word line in a second sub-block (e.g., WLL0 in SB1, FIG. 7). In this case, programming setting(s) which was obtained for the memory cells in the first sub-block can be used for subsequent programming of those memory cells as well as the memory cells in the second sub-block.

Moreover, the second sub-block can be omitted from the evaluation process when it is programmed, in one approach. Or, an evaluation of the second sub-block can be used to update the programming setting(s) which is subsequently used to guide programming of the first or second sub-blocks.

FIG. 11B depicts an example process for sensing a set of memory cells while decreasing a voltage of a selected word line as described in step 1104a of FIG. 11A. Typically the sensing of the set of memory cell involves a range of voltages which is substantially lower than the program voltage. Accordingly, the selected word line voltage can be decreased from the program voltage to an intermediate voltage, which is a first voltage used in the evaluation. The selected word line voltage can then be decreased from the intermediate voltage to a final voltage which can be the same as, or higher than the verify voltage (or the initial verify voltage if there is more than one). For instance, in FIG. 9A, the intermediate voltage can be V5 or V11 when the evaluation involves the lower or upper tail, respectively, and the final voltage can be VvP or V6, respectively. In FIG. 9D, the intermediate voltage can be V16 and the final voltage can be VvA. In one approach, the intermediate voltage is fixed and is independent of the programming setting(s).

In another approach, step 1119 determines an intermediate voltage based on programming setting(s) in the storage location for the set of memory cells. This approach sets the intermediate voltage adaptively to potentially reduce the total number of sense operations that occur and therefore reduce the sensing time between the program voltage and the verify voltage. For instance, if it is known that the tail of the Vth distribution was sensed as being relatively low in the last evaluation, the intermediate voltage can be set at a relatively low level, due to an expectation that the tail did not shift significantly higher since the last evaluation. Sense circuits may be configured to start the repeated sensing of the set of memory cells when the decreasing voltage is at a specified voltage which is based on programming setting(s) indicating an amount of degradation of the set of memory cells.

Step 1120 includes decreasing the voltage of the selected word lines from the program voltage to the intermediate voltage at a first rate. This can be the highest rate available to the voltage driver 447 (FIG. 3) and can involve requesting a step change in the voltage. Due to limitations of the voltage driver and the RC time constant of the word lines, there is a finite delay between the requested voltage and the actual word line voltages. For example, see FIG. 13C, plot 1340 at t3-t4, FIG. 13D, plot 1360 at t3-t4, FIG. 13E, plot 1380 at t3-t4 and FIG. 13F, plot 1480 at t3-t4. Step 1121 includes beginning a controlled ramp down of the selected word line voltage at a second rate, where the second rate is lower than the first rate in magnitude. For example, see FIG. 13C, plot 1340 at t4-t5, FIG. 13D, plot 1360 at t4-t5, FIG. 13E, plot 1380 at t4-t5 and FIG. 13F, plot 1480 at t4-t5 and t6-t7.

Step 1122 includes sensing the selected memory cells at sense times during the controlled ramp down. For example, the memory cells may be sensed repeatedly at specified time increments. For example, see FIG. 13C, plot 1340 at t4-t5, FIG. 13D, plot 1360 at t4-t5, FIG. 13E, plot 1380 at t4-t5 and FIG. 13F, plot 1480 at t4-t5 and t6-t7, where the circles in the specified time intervals denote times in which sensing occurs and the associated word line voltages.

Based on the sensing, step 1123 includes counting the number of memory cells in a conductive or non-conductive state. Step 1124 includes comparing the number to a threshold. For example, when the evaluation involves detecting a lower tail of a Vth distribution, the transition of the count of conductive memory cells below a threshold count (e.g., 1-3%) as the selected word line voltage decreases denotes the presence of the lower tail of the Vth distribution, in one approach. Referring to FIG. 9A, for instance, assume the lower tail of the Vth distribution 902 is being detected, and that the word line voltages VvP-V5 are applied in a decreasing order, with V5 first. The number of memory cells which are sensed as being conductive will decreases progressively as V5, V4 and V3 are applied. The number will be zero to or close to zero, e.g., perhaps less than 1-3% of the total number of memory cells on the selected word line, when V2 is applied. This indicates the lower tail of the Vth distribution 902 falls in the voltage range of V2-V3.

Or, assume the upper tail of the Vth distribution 902 is being detected, and that the word line voltages V6-V11 are applied in a decreasing order, with V11 first. The number of memory cells which are sensed as being non-conductive will initially be zero or close to zero, e.g., perhaps less than 1-3% of the total number of memory cells on the selected word line, when V11 and V10 are applied. This indicates the upper tail of the Vth distribution 902 falls in the voltage range of V10-V11. The transition of the count of non-conductive memory cells above a threshold count (e.g., 1-3%) as the selected word line voltage decreases denotes the presence of the upper tail of the Vth distribution, in one approach.

A decision step 1125 determines whether another sensing is to be performed. As mentioned, in one approach, there is a predetermined number of sense times during the decreasing voltage. In another approach, the sensing stops based on results of previous sensing during the decreasing voltage. For example, when the tail is detected, it is possible to terminate any further sensing of the evaluation and to request that the voltage driver output the verify voltage to proceed to a verify test. Or, if no verify test is performed, the voltage driver can be requested to output some other final voltage of the program loop such as 0 V. If the decision step 1125 is true, step 1122 is repeated. If the decision step 1125 is false, in one option step 1126 is reached in which the selected word line voltage is already at a verify voltage or other final voltage. In this case, the verify voltage is the last voltage in the controlled ramp down of the selected word line voltage. For example, see the voltage depicted by a circle 1348 in FIG. 13C which is the same as VvP or VvA, and the voltage depicted by a circle 1468 in FIG. 13F which is the same as VvP.

In another option, step 1127 is reached, which involves decreasing the selected word line voltage to a verify voltage or other final voltage. In this case, the verify voltage is lower than the last voltage in the ramp down sensing of the selected word line voltage. The transition to the verify voltage in step 1127 may involve requesting a step change in the voltage of the voltage driver. For example, see the transition from the voltage depicted by a circle 1368 to the voltage depicted by a circle 1371a (e.g., 0 V) in FIG. 13D, and the transition from the voltage depicted by a circle 1388 to the voltage depicted by a circle 1389 (e.g., VvP) in FIG. 13E.

FIG. 11C depicts an example process for determining updated programming setting(s) based on sensing data as described in step 1104b of FIG. 11A. Step 1110 includes inputting sensing data, e.g., at the controller 122 or control circuitry 110 (FIG. 1). In one option, step 1111 involves identifying a tail of a Vth distribution of the set of memory cells, such as discussed in connection with FIGS. 9A and 9D, and step 1112 includes determining updated programming setting(s) based on the tail (e.g., based on the voltage range in which the tail falls). See also FIG. 11D. In another option, step 1113 involves determining a program loop in which a program milestone is reached, such as discussed in connection with FIG. 9C, and step 1114 includes determining updated programming setting(s) based on the program loop. See also FIG. 11E. In either option, step 1115 includes storing the updated programming setting(s) in the storage location.

FIG. 11D depicts a plot of an initial Vpgm versus the detected tail of a Vth distribution of a set of memory cells, in an example implementation of step 1112 of FIG. 11C. The detected Vth of the tail may be in one of the voltage ranges of VvP-V1, V1-V2, V2-V3, V3-V4 or V4-V5, consistent with FIG. 9A. As mentioned, programming setting(s) such as an initial program voltage (see, e.g., FIGS. 10A and 10B) can be adjusted for a set of memory cells, such as memory cells connected to a word line. The adjustment can be based on the Vth of the tail as determined by ramp down sensing which occurs between the program voltage and the verify voltage in a program loop. In this example, the initial Vpgm decreases as the Vth of the tail (e.g., the upper or lower tail) increases. When the Vth of the tail is relatively high, this indicates a relatively high amount of over programming or degradation of the set of memory cells, and a relatively high program speed, so that a relatively lower initial Vpgm should be used in subsequent program operations as a compensation to reduce the over programming.

The position of the tail indicates a degree of over programming of the memory cells. The degree is greater when the Vth of the lower tail is higher.

FIG. 11E depicts a plot of an initial Vpgm versus a loop number in which a set of memory cells reaches a program milestone, in an example implementation of step 1114 of FIG. 11C. Similar to the approach of FIG. 11D, programming setting(s) such as an initial program voltage can be adjusted for a set of memory cells based on a program loop in which a program milestone is reached during a program operation. The Vth of the tail and the program loop in which a program milestone is reached are both indicators of the program speed of the memory cells. In this example, the initial Vpgm decreases as the program loop decreases. When the program loop to reach a given program milestone is relatively low, this indicates a relatively high program speed, so that a relatively lower initial Vpgm should be used to reduce the program speed in subsequent program operations.

FIG. 11F depicts a plot of an intermediate voltage (Vint) versus a lower tail of a Vth distribution of a set of memory cells, in an example implementation of step 1119 of FIG. 11B. Vint is the starting voltage of a decreasing ramp voltage using during the ramp down sensing. Examples of decreasing ramp voltage are depicted at FIG. 13C, plot 1340 at t4-t5, FIG. 13D, plot 1360 at t4-t5, FIG. 13E, plot 1380 at t4-t5 and FIG. 13F, plot 1480 at t4-t5 and t6-t7.

The detected Vth of the tail may be in one of the voltage ranges of VvP-V1, V1-V2, V2-V3, V3-V4 or V4-V5, consistent with FIG. 9A. As mentioned, sensing time can be reduced by reducing Vint, the initial sensing voltage on the selected word line, during the sensing which occurs between the program voltage and the verify voltage. Reducing Vint reduces the number of sense points and therefore the total sense time in the ramp down sensing. This can be done mainly for a fresh memory device with a low number of cycles. As the Vth of the tail increases, Vint should increase as well. For example, Vint may be set to be at a specified voltage increment above the Vth of the tail. For instance, when the Vth of the tail is in the range of VvP-V1, V1-V2 or V2-V3, Vint may be set at two increments higher at V3, V4 or V5, respectively. When the Vth of the tail is above V3, Vint is set to the maximum level of V5.

Figure 12:
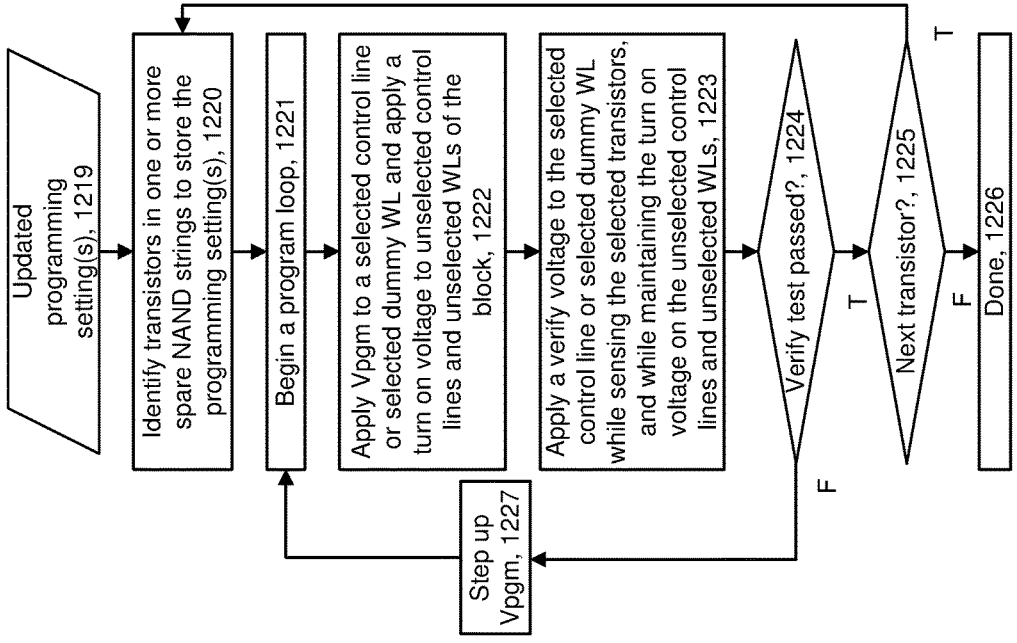
FIG. 12 depicts an example process for storing updated programming setting(s) in one or more spare sets of NAND strings, consistent with step 1115 of FIG. 11C and with FIGS. 11D and 11E.

FIG. 12 depicts an example process for storing updated programming setting(s) in one or more spare sets of NAND strings, consistent with step 1115 of FIG. 11C and with FIGS. 11D and 11E. For instance, the updated programming setting(s) can be the initial Vpgm obtained from FIG. 11D or 11E. Note that Vint, which was obtained from FIG. 11F, can be determined from the programming setting(s), or Vint can be stored as a separate value in addition to the programming setting(s). For example, Vint can increase as the initial program voltage decreases. Step 1219 includes inputting the updated programming setting(s) to the controller 122 or control circuitry 110, for instance, based on a read of the storage location. Step 1220 includes identifying transistors in one or more spare NAND strings to store the programming setting(s). As mentioned, e.g., in connection with FIGS. 8C and 8D, the transistors eligible to store programming setting(s) can include dummy memory cells and/or select gate transistors in spare NAND strings.

Step 1221 begins a program loop. Step 1222 includes applying Vpgm to a selected control line (e.g., an SGD or SGS control line) or selected dummy word line (WL) and applying a turn on voltage to unselected control lines and unselected word lines (both unselected dummy and data word lines) of the block. Step 1223 includes applying a verify voltage to the selected control line or selected dummy word line while sensing the selected transistors and while maintaining the turn on voltage on the unselected control lines and unselected word lines. At step 1224, if the verify test is passed, and there is no next transistor to program at decision step 1225, the program operation is done at step 1226. If the verify test fails at step 1224, Vpgm is stepped up at step 1227 and a next program loop begins at step 1221. If there is a next transistor to program at decision step 1225, step 1220 is reached.

The programming of the transistors can involve SLC or MLC programming, as mentioned, and the program operation can be set accordingly, e.g., similar to FIG. 10A or 10B, respectively.

The programming setting(s) can be stored as a non-volatile flag in units such as bytes or other sets of bits. Further, the update to the programming setting(s) may involve changing only a portion of the data in a way which avoids the need for an erase operation. For example, assume a 0 bit is stored in the Er state and a 1 bit is stored in the P state. When the programming setting(s) is an initial program voltage, for instance, the sets of bits which represent different initial program voltages can be configured based on an assumption that the initial program voltage increases over time. In one example, a bit string 00000000 correlates to a default initial program voltage, a bit string 10000000 correlates to the default initial program voltage minus a delta voltage, a bit string 11000000 correlates to the default initial program voltage minus 2× the delta voltage, and so forth. In this case, the updating of the programming setting(s) involves programming transistors to change selected bits from 0 to 1, and there is no need for erasing of the transistors to update the programming setting(s). This facilitates the storing of the programming setting(s).

In FIG. 13A-13F, the vertical axis depicts a word line voltage (Vwl) and the horizontal axis depicts time, where the time scales are not necessarily the same. Also, circles and squares denote a requested voltage output of the selected and unselected word line voltage drivers 447 and 448 (FIG. 3), respectively. The requested voltage output at a given voltage is maintained until a new requested output at a different voltage. There is a delay between the request and actual output voltages, as mentioned. The time period depicted comprises one program loop.

FIG. 13A depicts example voltage signals applied to word lines during a program loop, where the voltages on the selected and unselected word lines are decreased to 0 V between the program voltage and the verify voltages, as a comparative example to steps 1104 and 1104a of the programming process of FIG. 11A. In this comparative example, the total time used by the program loop is relatively high due to the time used to decrease the voltages on the selected and unselected word lines to 0 V from t3-t5, the time used to subsequently increase the voltages from t6-t8, and the time margin t5-t6. The program loop includes a program portion from t0-t5 and a verify portion from t6-t14.

In the program portion, plot 1300 depicts the selected word line voltage. The requested voltage is 0 V at t0 (circle 1310a), Vturn on at t1 (circle 1311a), Vpgm at t2 (circle 1312), and 0 V at t3 (circle 1313a). Plot 1301 depicts the unselected word line voltage. The requested voltage is 0 V at t0 (square 1310), Vturn on at t1 (square 1311), and 0 V at t3 (square 1313).

In the verify portion, plot 1303 depicts the selected word line voltage. The requested voltage is VvA at t7 (circle 1316), VvB at t9 (circle 1317), VvC at t11 (circle 1318), and 0 V at t13 (circle 1319a). Plot 1302 depicts the unselected word line voltage. The requested voltage is Vturn on at t6 (square 1315), and 0 V at t13 (square 1319). The verify tests for the A, B and C states occur at t8, t10 and t12, respectively.

FIG. 13B depicts example voltage signals applied to word lines during a program loop, consistent with FIG. 11A and step 1104, where the selected word line voltage decreases from the program voltage to the lowest verify voltage of multiple verify voltages without performing ramp down sensing, consistent with FIG. 9B. In FIG. 13B-13F, the unselected word line voltage remains at a turn on voltage during the program and verify portions of the program loop. This approach provides a time savings compared to FIG. 13A because the selected word line voltage is not decreased below the initial verify voltage, VvA, and because the unselected word line voltage is maintained at Vturn on. Note that Vturn on could be different during the program portion compared to the verify portion of the program loop but is shown as being at a constant level in this example.

The program loop includes a program portion from t0-t3 and a verify portion from t4-t9. Plot 1320 depicts the selected word line voltage. The requested voltage is 0 V at t0 (circle 1324a), Vturn on at t1 (circle 1325a), Vpgm at t2 (circle 1326), and VvA at t3 (circle 1327). The program voltage can temporarily pause at a level such as Vturn on to avoid a single large transition which can have undesired coupling effects. The requested voltage is VvA at t3 (circle 1327), VvB at t5 (circle 1329), VvC at t7 (circle 1330), and 0 V at t9 (circle 1332a). Note that the selected word line voltage reaches VvA at t4 and is maintained at that voltage to allow an A state verify test to be performed. The verify tests for the A, B and C states occur at t4a, t6 and t8, respectively.

Plot 1321 depicts the unselected word line voltage. The requested voltage is 0 V at t0 (square 1324), Vturn on at t1 (square 1325) and 0 V at t9 (square 1332).

FIG. 13C depicts example voltage signals applied to word lines during a program loop, consistent with FIG. 11A and step 1104a, where the selected word line voltage decreases from the program voltage (program level) to a verify voltage (verify level) while ramp down sensing is performed to detect a lower tail of a Vth distribution, consistent with FIG. 9A, voltages VvP-V5, or an upper tail of a Vth distribution, consistent with FIG. 9D, voltages VvA-V16. The program loop includes a program portion from t043, a ramp down sensing portion from t4-t5, and a verify portion from t5-t7.

Plot 1340 depicts the selected word line voltage. The requested voltage is 0 V at t0 (circle 1343a), Vturn on at t1 (circle 1344a), Vpgm at t2 (circle 1345), and a reduced level (Vint) of V5 or V16 at t3 (circle 1346) for the examples of FIGS. 9A and 9D, respectively. The selected word line voltage is ramped down at a controlled rate from t4-t5 while periodic sensing occurs as indicated by each circle. See example circles 1347, 1350 and 1348, which may represent voltages at first, second and sixth sensing operations or sense times, respectively. The selected word line voltage is maintained at VvP or VvA from t5-t7 to optionally allow a verify test to be performed at t6. In this example, VvP and VvA are assumed to be equal, and Vv5 and Vv16 are assumed to be equal for simplicity. The requested voltage is 0 V at t7 (circle 1349a).

In one option, the circle 1348 represents the verify voltage and an associated sensing occurs at t5 as part of the ramp down sensing and Vth tail detection. An additional sensing at the same verify voltage may occur at t6 as part of a verify test when the selected word line voltage has time to stabilize from t5-t6. This can result in a more accurate sensing compared to the rough sensing which occurs while the word line voltage is being ramped down. Optionally, as in FIG. 13D, the final sensing point in the ramp down sensing and Vth tail evaluation is taken as the verify result as well.

Plot 1341 depicts the unselected word line voltage. The requested voltage is 0 V at t0 (square 1343), Vturn on at t1 (square 1344) and 0 V at t7 (square 1349).

FIG. 13D depicts example voltage signals applied to word lines during a program loop, consistent with FIG. 11A and step 1104a, where the selected word line voltage decreases from the program voltage while ramp down sensing is performed to detect a lower tail of a Vth distribution, or an upper tail of a Vth distribution, consistent with FIG. 9D, voltages VvA-V16, and no verify test is performed or the final sense result is used as the verify result, consistent with FIG. 9A, voltages VvP-V5. The program loop includes a program portion from t0-t3, and a ramp down sensing portion from t4-t5.

Plot 1360 depicts the selected word line voltage. The requested voltage is 0 V at t0 (circle 1363a), Vturn on at t1 (circle 1364a), Vpgm at t2 (circle 1365), and V5 or V16 at t3 (circle 1366) for the examples of FIGS. 9A and 9D, respectively. The selected word line voltage is ramped down at a controlled rate from t4-t5 while periodic sensing occurs as indicated by each circle. See example circles 1367 and 1368, which may represent voltages at first and sixth sensing operations or sense times, respectively. The selected word line voltage decreases directly to 0 V at t6 without being stabilized at a level which allows for a high accuracy verify test, as in FIG. 13C. In this example, VvP and VvA are assumed to be equal, and Vv5 and Vv16 are assumed to be equal for simplicity. The requested voltage is 0 V at t6 (circle 1371a).

In one option, the circle 1368 represents the verify voltage and an associated sensing occurs at t5. This verify test may be sufficiently accurate even if the word line voltage is not stabilized. This approach saves time since additional time is not used to stabilize the word line voltage.

Plot 1361 depicts the voltage on the unselected word lines. The requested voltage is 0 V at t0 (square 1363), Vturn on at t1 (square 1364) and 0 V at t6 (square 1371).

FIG. 13E depicts example voltage signals applied to word lines during a program loop, consistent with FIG. 11A and step 1104a, where the selected word line voltage decreases from the program voltage to a verify voltage while ramp down sensing is performed to detect an upper tail of a Vth distribution, consistent with FIG. 9A, voltages V6-V11. Since the range of sensing voltages for the upper tail of a Vth distribution is higher than the verify voltage, there will be a step down in the selected word line voltage after the ramp down sensing and before the verify test, e.g., from t5-t6.

The program loop includes a program portion from t043, a ramp down sensing portion from t4-t5, and a verify portion from t6-t8.

Plot 1380 depicts the selected word line voltage. The requested voltage is 0 V at t0 (circle 1383a), Vturn on at t1 (circle 1384a), Vpgm at t2 (circle 1385), and V11 at t3 (circle 1386). The selected word line voltage is ramped down at a controlled rate from t4-t5 while periodic sensing occurs as indicated by each circle. See example circles 1387 and 1388, which may represent voltages at first and sixth sensing operations or sense times, respectively. The selected word line voltage decreases directly to VvP at t6 and is stabilized for a verify test at t7. The requested voltage is 0 V at t8 (circle 1390a).

Plot 1381 depicts the voltage on the unselected word lines. The requested voltage is 0 V at t0 (square 1383), Vturn on at t1 (square 1384) and 0 V at t8 (square 1390).

FIG. 13F depicts example voltage signals applied to word lines during a program loop, consistent with FIG. 11A and step 1104a, where the selected word line voltage decreases from the program voltage to a verify voltage while a first sequence of ramp down sensing is performed (at t4-t5) to detect an upper tail of a Vth distribution, consistent with FIG. 9A, voltages V6-V11, and a second sequence of ramp down sensing (at t6-t7) is performed to detect a lower tail of a Vth distribution, consistent with FIG. 9A, voltages VvP-V5.

The program loop includes a program portion from t043, a ramp down sensing portion from t4-t7, and a verify portion from t7-t8.

Plot 1480 depicts the selected word line voltage. The requested voltage is 0 V at t0 (circle 1483a), Vturn on at t1 (circle 1484a), Vpgm at t2 (circle 1485), and V11 at t3 (circle 1486). The selected word line voltage is ramped down from V11 to V6 at a controlled rate in a first sequence from t4-t5 while periodic sensing occurs as indicated by each circle. See example circles 1487 and 1488, which may represent voltages at first and sixth sensing operations or sense times, respectively, in the first sequence. The selected word line voltage is then requested to step down to V5 at t6 (circle 1467).

The selected word line voltage is then ramped down from V5 to VvP at a controlled rate in a second sequence from t6-t75 while periodic sensing occurs as indicated by each circle. See example circles 1467 and 1468, which may represent voltages at first and sixth sensing operations or sense times, respectively, in the second sequence. The selected word line voltage then is stabilized for a verify test at t7a. The requested voltage is 0 V at t8 (circle 1490a).

Plot 1481 depicts the voltage on the unselected word lines. The requested voltage is 0 V at t0 (square 1483), Vturn on at t1 (square 1484) and 0 V at t8 (square 1490).

In one implementation, an apparatus comprises: a set of memory cells connected to a selected word line; a voltage driver configured to, in a program operation, apply a program voltage followed by a decreasing voltage to the selected word line; and sense circuits configured to perform repeated sensing of the set of memory cells during the decreasing voltage.

In another implementation, a method comprises: setting a control gate voltage of a set of memory cells to a program voltage; setting the control gate voltage of the set of memory cells to a verify voltage for a verify test; decreasing the control gate voltage at a first rate from the program voltage to an intermediate voltage which is between the program voltage and the verify voltage; decreasing the control gate voltage at a second rate, which is lower in magnitude than the first rate, from the intermediate voltage to the verify voltage; and sensing the set of memory cells during the decreasing of the control gate voltage at the second rate.

In another implementation, an apparatus comprises: a set of memory cells in a block; means for applying a program voltage to the set of memory cells; means for decreasing a voltage of the set of memory cells from the program voltage to a verify voltage; and means performing a verify test for the set of memory cells when the voltage of the set of memory cells reaches the verify voltage.

The means for applying a program voltage may include the power control module 116 of FIG. 1, the voltage driver 447, row decoder 124 and pass transistors 422 of FIG. 3, or other logic hardware, and/or other executable code stored on a computer readable storage medium or device. Other embodiments may include similar or equivalent means.

The means for decreasing the voltage may also include the power control module 116 of FIG. 1, the voltage driver 447, row decoder 124 and pass transistors 422 of FIG. 3, or other logic hardware, and/or other executable code stored on a computer readable storage medium or device. Other embodiments may include similar or equivalent means.

The means for performing a verify test may include the power control module 116 and sense blocks 51-53 of FIG. 1, the sense block 51 of FIG. 2, and the voltage driver 447, row decoder 124 and pass transistors 422 of FIG. 3, or other logic hardware, and/or other executable code stored on a computer readable storage medium or device. Other embodiments may include similar or equivalent means.

In another implementation, an apparatus comprises: a plurality of NAND strings arranged in a block, each NAND string comprising data memory cells connected to data word lines; a voltage driver configured to apply a program voltage, an evaluation voltage and a verify voltage to a selected data word line; and sense circuits configured to detect a tail of a threshold voltage distribution of memory cells connected to the selected data word line during the evaluation voltage, and to determine whether the memory cells connected to the selected data word line pass a verify test during the verify voltage, wherein the evaluation voltage is greater than the verify voltage.

In another implementation, a system comprises: a controller configured to receive a program command; and a memory die connected to the controller. The memory die comprises: a set of connected memory cells; a voltage driver configured to, in response to the program command, apply a control gate voltage at a program level to the set of connected memory cells, step down the control gate voltage from the program level to a reduced level, and ramp down the control gate voltage from the reduced level to a verify level at a controlled ramp rate; and sense circuits configured to repeatedly sense the set of connected memory cells during the ramp down of the control gate voltage, and configured to sense the set of connected memory cells during the application of the control gate voltage at the verify level.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells connected to a selected word line;
a voltage driver configured to, in a program operation, apply a program voltage to the selected word line followed by ramping down a voltage of the selected word line; and
sense circuits configured to perform repeated sensing of the set of memory cells during the ramping down of the voltage of the selected word line.

2. The apparatus of claim 1, further comprising:
a control circuit configured to evaluate a degree of over programming of the set of memory cells based on the repeated sensing of the set of memory cells, and to adjust programming setting(s) of a subsequent program operation based on the degree of over programming.

3. The apparatus of claim 1, further comprising:
a control circuit configured to detect a tail of a threshold voltage distribution of the set of memory cells based on the repeated sensing of the set of memory cells.

4. The apparatus of claim 3, wherein:
the sense circuits are configured to stop the repeated sensing of the set of memory cells when the tail of the threshold voltage distribution of the set of memory cells is detected.

5. The apparatus of claim 1, wherein:
in each of a plurality of program loops of the program operation, the voltage driver configured to apply the program voltage then ramp down the voltage of the selected word line, and the sense circuits configured to perform the repeated sensing of the set of memory cells during the ramping down of the voltage of the selected word line; and
the repeated sensing indicates that the set of memory cells reaches a program milestone in one program loop of the plurality of program loops.

6. The apparatus of claim 5, further comprising:
a control circuit configured to adjust programming setting(s) of a subsequent program operation based on the one program loop.

7. The apparatus of claim 1, wherein:
the sense circuits configured to start the repeated sensing of the set of memory cells during the ramping down of the voltage of the selected word line when the voltage of the selected word line is at a voltage which is based on programming setting(s) of the set of memory cells.

8. The apparatus of claim 1, wherein:
the voltage driver configured to, in the program operation, apply a verify voltage to the selected word line after the ramping down of the voltage of the selected word line the voltage of the selected word line is ramped down to the verify voltage; and
the sense circuits configured to sense the set of memory cells when the verify voltage is applied to the selected word line.

9. The apparatus of claim 8, further comprising:
a set of memory cells connected to an unselected word line; and
a voltage driver configured to apply a turn on voltage continuously to the unselected word line during the applying of the program voltage, during the ramping down of the voltage of the selected word line and when the verify voltage is applied to the selected word line, the turn on voltage provides the set of memory cells connected to the unselected word line in a conductive state.

10. The apparatus of claim 1, wherein:
the voltage of the selected word line decreases from the program voltage at a first rate before the ramping down of the voltage of the selected word line, which is at a second rate which is lower in magnitude than the first rate.

11. The apparatus of claim 1, wherein:
the sense circuits configured to perform the repeated sensing of the set of memory cells during the ramping down of the voltage of the selected word line in one program loop but not all program loops of a plurality of program loops of the program operation.

12. The apparatus of claim 1, further comprising:
a set of bit lines connected to the set of memory cells, the sense circuits detect a voltage on the bit lines during the repeated sensing.

13. A method, comprising:
setting a control gate voltage of a set of memory cells to a program voltage;
setting the control gate voltage of the set of memory cells to a verify voltage for a verify test;
decreasing the control gate voltage at a first rate from the program voltage to an intermediate voltage which is between the program voltage and the verify voltage;
decreasing the control gate voltage at a second rate, which is lower in magnitude than the first rate, from the intermediate voltage to the verify voltage; and
sensing the set of memory cells during the decreasing of the control gate voltage at the second rate.

14. The method of claim 13, wherein:
the set of memory cells are not sensed during the decreasing of the control gate voltage at the first rate; and
the set of memory cells are sensed repeatedly during the decreasing of the control gate voltage at the second rate.

15. The method of claim 13, further comprising:
storing data indicating a voltage range of a tail of a threshold voltage distribution of the set of memory cells; and
adjusting programming setting(s) of a program operation for the set of memory cells based on the voltage range.

16. An apparatus, comprising:
a set of memory cells in a block;
means for applying a program voltage to the set of memory cells;
means for decreasing a voltage of the set of memory cells from the program voltage to a verify voltage;
means performing a verify test for the set of memory cells when the voltage of the set of memory cells reaches the verify voltage; and
means for maintaining a turn on voltage on control gates of unselected memory cells in the block during the program voltage, the decreasing of the voltage and the verify test.

17. An apparatus, comprising:
a plurality of NAND strings arranged in a block, each NAND string comprising data memory cells connected to data word lines;
a voltage driver configured to apply a program voltage, an evaluation voltage and a verify voltage to a selected data word line; and
sense circuits configured to detect a tail of a threshold voltage distribution of data memory cells connected to the selected data word line during the applying of the evaluation voltage, and to determine whether the data memory cells connected to the selected data word line pass a verify test during the applying of the verify voltage, wherein the evaluation voltage is greater than the verify voltage.

18. The apparatus of claim 17, wherein:
the NAND strings comprise primary NAND strings and spare NAND strings;
each NAND string comprise a dummy memory cell; and
a control circuit is configured to store data identifying the tail in the dummy memory cells of the spare NAND strings.

19. The apparatus of claim 17, wherein:
the NAND strings comprise primary NAND strings and spare NAND strings;
each NAND string comprises a select gate transistor; and
a control circuit is configured to store data identifying the tail in the select gate transistors of the spare NAND strings.

20. The apparatus of claim 17, wherein:
the evaluation voltage is part of a decreasing ramp voltage;
a starting voltage of the decreasing ramp voltage is less than the program voltage; and
a final voltage of the decreasing ramp voltage is the verify voltage.

21. A system, comprising:
a controller configured to receive a program command; and
a memory die connected to the controller, the memory die comprises:
a set of connected memory cells;
a voltage driver configured to, in response to the program command, apply a control gate voltage at a program level to the set of connected memory cells, step down the control gate voltage from the program level to a reduced level, and ramp down the control gate voltage from the reduced level to a verify level at a controlled ramp rate; and
sense circuits configured to repeatedly sense the set of connected memory cells during the ramp down of the control gate voltage, and configured to sense the set of connected memory cells during the application of the control gate voltage at the verify level.

22. The apparatus of claim 1, wherein:
the ramping down of the voltage of the selected word line is at a controlled rate.

* * * * *